(12) United States Patent
Lenker et al.

(10) Patent No.: US 12,092,702 B2
(45) Date of Patent: Sep. 17, 2024

(54) METHOD AND APPARATUS FOR DETECTION OF A FUSE FAILURE

(71) Applicant: Future Systems Besitz GmbH, Rödental (DE)

(72) Inventors: Hubert Lenker, Sonneberg (DE); Joram Masel, Kueps-Oberlangenstadt (DE); Bernhard Först, Kronach (DE)

(73) Assignee: Future Systems Besitz GmbH (DE)

( * ) Notice: Subject to any disclaimer, the term of this patent is extended or adjusted under 35 U.S.C. 154(b) by 0 days.

(21) Appl. No.: 17/906,788

(22) PCT Filed: Mar. 25, 2022

(86) PCT No.: PCT/EP2022/057954
§ 371 (c)(1),
(2) Date: Sep. 20, 2022

(87) PCT Pub. No.: WO2022/200589
PCT Pub. Date: Sep. 29, 2022

(65) Prior Publication Data
US 2024/0210493 A1  Jun. 27, 2024

(30) Foreign Application Priority Data
Mar. 25, 2021  (EP) .................................... 21164816

(51) Int. Cl.
*G01R 31/74* (2020.01)
*G01R 19/15* (2006.01)
(Continued)

(52) U.S. Cl.
CPC ............. *G01R 31/74* (2020.01); *G01R 19/15* (2013.01); *G01R 31/52* (2020.01); *H02H 3/046* (2013.01)

(58) Field of Classification Search
CPC ................................ G01R 31/74; H02H 3/046
(Continued)

(56) References Cited

U.S. PATENT DOCUMENTS

| 4,858,054 A * | 8/1989 | Franklin ................ H02H 3/023 361/57 |
| 2010/0023286 A1 * | 1/2010 | Rodseth ................ H02H 3/046 702/65 |

(Continued)

FOREIGN PATENT DOCUMENTS

| CN | 104183439 A1 | 12/2014 |
| CN | 105047501 A1 | 11/2015 |

(Continued)

*Primary Examiner* — Tung X Nguyen
*Assistant Examiner* — Robert P Alejnikov, Jr.
(74) *Attorney, Agent, or Firm* — Maginot, Moore & Beck, LLP

(57) ABSTRACT

A method for detection of a fuse failure of a protective fuse used to protect an associated load against overcurrent and/or against overload includes the steps of: measuring electrical current flowing through the protective fuse in a current path to the load by means of a current sensor element; determining one or more failure indicators adapted to indicate a possible failure of the protected fuse on the basis of the measured electrical current; and detecting automatically a failure of the protective fuse if the determined at least one failure indicator indicates a possible failure of the protective fuse and if the electrical current stopped to flow through the protective fuse or is below a predefined current threshold value.

38 Claims, 9 Drawing Sheets

(51) Int. Cl.
  *G01R 31/52*   (2020.01)
  *H02H 3/04*   (2006.01)
(58) Field of Classification Search
  USPC .......................................................... 324/550
  See application file for complete search history.

(56) References Cited

U.S. PATENT DOCUMENTS

| | | | |
|---|---|---|---|
| 2013/0321966 A1* | 12/2013 | Syngaevskiy .......... | H02H 3/093 |
| | | | 361/87 |
| 2019/0237959 A1* | 8/2019 | Winick ................ | H02H 1/0007 |
| 2020/0062199 A1* | 2/2020 | Kwon ................... | H02H 3/085 |
| 2020/0091710 A1* | 3/2020 | Heinemann ............ | H02H 3/006 |
| 2022/0308123 A1* | 9/2022 | Lenker .................. | G01R 31/52 |

FOREIGN PATENT DOCUMENTS

| | | | | |
|---|---|---|---|---|
| CN | 108572300 A | * | 9/2018 | ............. G01R 31/74 |
| EP | 3575763 A1 | * | 12/2019 | ............... G01K 7/22 |
| EP | 3700038 A1 | * | 8/2020 | ........... H02H 1/0007 |
| ES | 2388163 B2 | | 6/2013 | |
| KR | 20200109628 A | * | 9/2020 | ............. G01R 31/74 |

\* cited by examiner

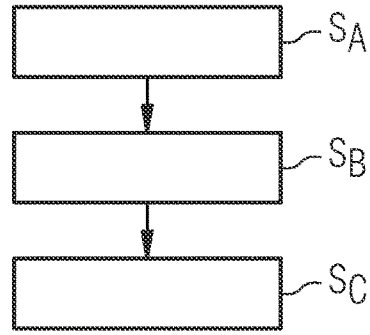
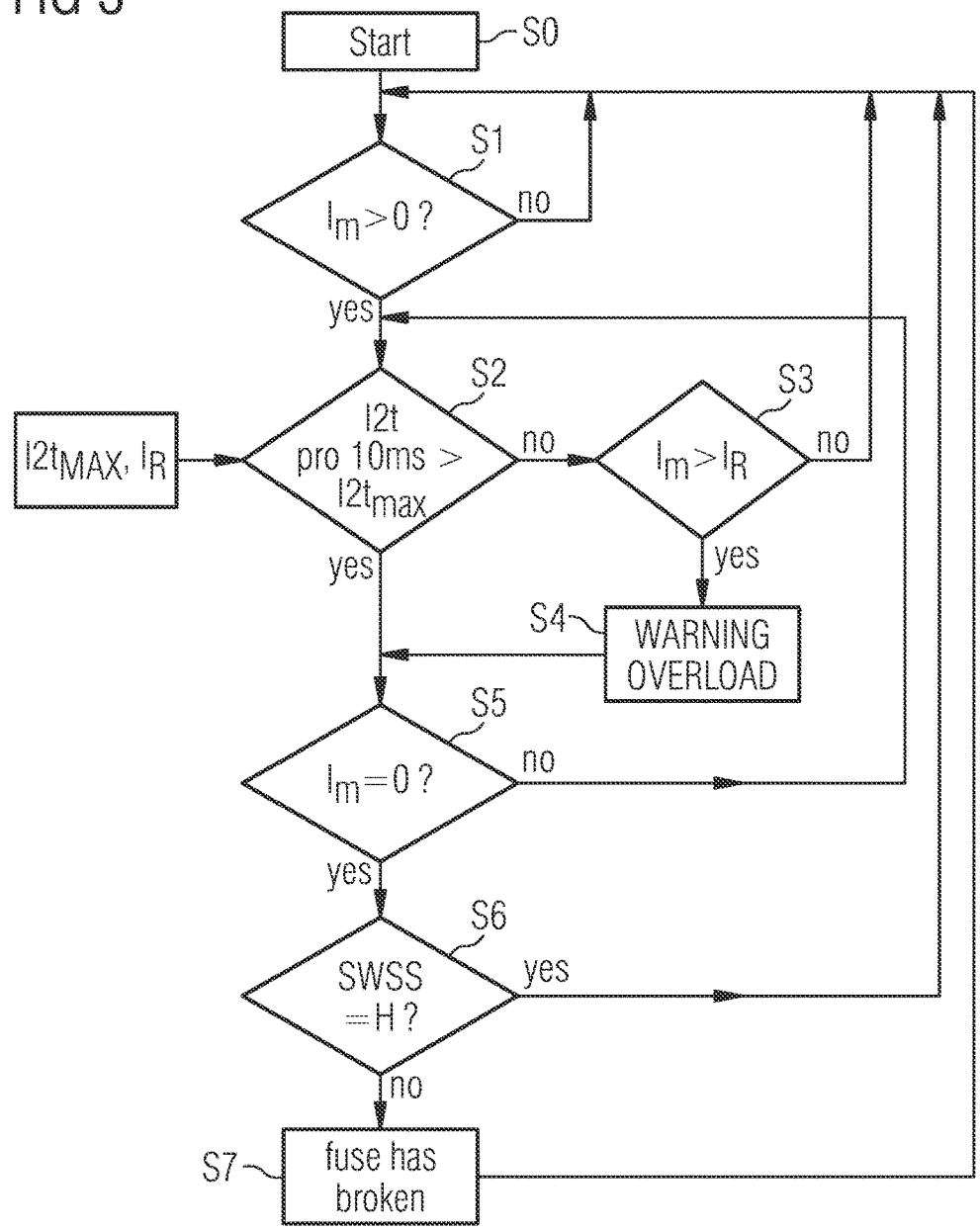

METHOD AND APPARATUS FOR DETECTION OF A FUSE FAILURE

TECHNICAL FIELD

The invention relates to a method and apparatus for detection of a failure of a protective fuse which is used to protect an associated load against overcurrent and/or against overload.

TECHNICAL BACKGROUND

Fuses are widely used as overcurrent protection devices having a fusible part which is heated and severed by the passage of an electrical overcurrent flowing through the fuse. Different fuses can be used in electrical distribution systems. There is a great variety of different kinds of electrical fuses.

An electrical overcurrent comprises any electrical current which is larger than what the load is rated to carry under specified conditions. Unless removed in time, even low overcurrents can overheat system components of a distributed system, which in turn can damage insulation, conductors and other equipment of the system. Such overcurrents can even melt conductors and vaporize provided insulation. Very high electrical currents can produce magnetic forces and may even bend and twist busbars.

In general, there are two major types of overcurrent fault conditions, i.e., overload fault condition and short circuit fault condition. In a short circuit fault condition, there is an overcurrent that flows outside its normal current path in the electrical circuit. A short circuit fault can be for example caused by an insulation breakdown or a faulty electrical connection. When a short circuit fault does occur, the electrical current can bypass the normal load and may take a shorter path, hence the term short circuit. An overload fault condition can be defined as an electrical overcurrent that is confined to the normal current path, which, however, if allowed to persist for a longer time in the electrical circuit, can cause damage to the equipment and/or to the connected wiring.

A protective fuse can be used to protect different kinds of loads including inductive loads, capacitive loads and resistive loads against an overload and/or a short circuit fault condition. For instance, a protective fuse can be used to protect an electrical motor connected to a motor protection switch. The motor protection switch is adapted to protect an electrical motor from overload and/or failure of an external conductor. If the motor isolation fails, then the motor protection can only disconnect the motor from the grid to prevent further damage from the grid. The motor is defect in this case. The other typical use case is the motor thermal protection, which turns off the motor in case the motor becomes too warm. In this case the motor stays operational and can be turned on again after cool down time. Motor protection can be used to prevent any damage to the electrical motor such as internal faults in the electrical motor. A three-phase motor protection switch can be provided in series to protective fuses. Accordingly, in many use cases, it is necessary to detect that protective electrical fuses have been damaged or broken because of an overcurrent. Therefore, in many use cases, a fuse failure supervision is required to increase operational reliability and operation safety of the distributed system. A fuse failure supervision for a protective fuse can be implemented for critical loads of the distributed system protected by an associated protective fuse. Other examples include emergency power systems or battery loading systems. In many use cases, the protective fuse is connected in series to an additional protective switch which may include a semiconductor protective switch or an electromechanical protective switch.

Conventional methods for detection of a failure of a protective fuse rely on a measured voltage drop along the protective fuse which as a consequence requires to measure the electrical potential on both sides of the protective fuse. To tap the potential difference at the protective fuse, two electrical wires are required and have to be connected on both sides of the protective fuse. This increases the necessary technical efforts and complexity of the circuitry. Further, the connected wires on both sides of the protective fuse may be interrupted in special cases, thus increasing the probability that a failure of the protective fuse is not detected. In this case, the operation safety of the distributed system is compromised.

Accordingly, there is a need to provide a method and apparatus for detection of a failure of a protective fuse which increases the reliability of the failure detection without increasing the complexity of the detection circuitry significantly.

SUMMARY

The invention provides according to a first aspect a method for detection of a fuse failure of a protective fuse used to protect an associated load against overcurrent and/or against overload, the method comprising the steps of:
measuring an electrical current, Im, flowing through the protective fuse in a current path to said load by means of a current sensor element;
determining one or more failure indicators each adapted to indicate a possible failure of the protected fuse on the basis of the measured electrical current, Im; and
detecting automatically a failure of the protective fuse if the determined at least one failure indicator indicates a possible failure of the protective fuse and if the electrical current, Im, measured by the current sensor element has stopped (Im=0) to flow through said protective fuse or is below a predefined current threshold value (Im<Imth).

The invention provides according to a further aspect a method for detection of a failure of a protective fuse used to protect an associated load against overcurrent and/or against overload, wherein the method comprises the steps of:
measuring an electrical current flowing through the protective fuse to said load by means of a current sensor element,
determining a thermal energy generated in the protective fuse depending on the measured electrical current and
detecting automatically a failure of the protective fuse if the determined thermal energy exceeds a predetermined threshold value and if the electrical current measured by the current sensor element has stopped to flow through said protective fuse.

Accordingly in a preferred embodiment a failure indicator that the determined thermal energy exceeds a predetermined threshold can be evaluated to detect that the protective fuse has failed. Other failure indicators or combinations of failure indicators can be used in alternative embodiments to detect a failure of the protective fuse.

An advantage of the method according to the present invention is that it operates reliably even in a harsh environment. A further advantage of the method according to the present invention is that failure of a protective fuse can be detected very fast within a short detection time of less than one millisecond.

In a possible embodiment of the method according to the present invention a first failure indicator comprises a calculated Ampere squared seconds (I2t) value indicating a thermal energy generated in the protective fuse exceeding a predefined threshold value.

In a possible embodiment of the method according to the present invention a second failure indicator comprises that an amplitude of a measured electrical current, Im, exceeds a predefined rated current, IR, of the protective fuse.

In a possible embodiment of the method according to the present invention a third failure indicator comprises a current increase or a current slope (dI/dt) of the measured electrical current, Im, exceeding a predefined current increase (dI/dt max).

In a possible embodiment of the method according to the present invention each failure indicator comprises a failure indicator flag being set or reset within a predefined evaluation cycle in response to the electrical current, Im, measured by the current sensor element within the predefined evaluation cycle.

In a possible embodiment of the method according to the present invention logical values of the failure indicator flags of the failure indicators set or reset in an evaluation cycle are stored in a register for the next evaluation cycle.

In a possible embodiment of the method according to the present invention the logical values of the failure indicator flags of the failure indicators are processed to calculate a confidence level indicating a total likelihood that the protective fuse has failed.

In a possible embodiment of the method according to the present invention a failure of the protective fuse is determined, if the calculated confidence level exceeds a predefined confidence level threshold and if the electrical current, Im, measured by the current sensor element has stopped to flow through said protective fuse or is below a predefined current threshold value (Im<Imth).

In a possible embodiment of the method according to the present invention the confidence level indicating a total likelihood that the protective fuse has failed is calculated depending on the logical values of failure indicator flags and/or depending on at least one external state signal.

In a possible embodiment of the method according to the present invention the external state signal comprises a switching state signal (SWSS) which indicates that the associated load has not been switched off externally by a protective switch.

In a possible embodiment of the method according to the present invention the failure indicators comprise multilevel failure indicators.

In a possible embodiment of the method according to the present invention the first failure indicator and the second failure indicator are scaled depending on a number, k, of parallel current paths connected to multiple loads.

In a possible embodiment of the method according to the present invention an average electrical current, Imavg, is calculated on the basis of the measured electrical currents, Im, flowing through parallel current paths to the load and is used as a predefined current threshold (Imth).

In a possible embodiment of the method according to the present invention if the determined thermal energy indicated by the calculated Ampere squared seconds (I2t) value does not exceed the predefined threshold value but the amplitude of the measured electrical current, Im, is higher than a pre-determined rated current, IR, an energy input into said protective fuse caused by a flowing electrical current is determined.

In a possible embodiment of the method according to the present invention if the deter-mined energy input into the protective fuse by the electrical current exceeds a predetermined threshold value, an overload failure warning signal (OFWS) indicating an imminent failure of the protective fuse due to an overload current is automatically generated.

In a possible embodiment of the method according to the present invention the energy input into the protective fuse is determined by calculating a heat transfer balance for the protective fuse as a difference between heat generated by the electrical current flowing through the protective fuse and heat dissipated by the protective fuse.

The invention provides according to a further aspect a fuse failure detection apparatus provided for detection of a failure of a protective fuse used to protect an associated load against overcurrent and/or against overload, said fuse failure detection apparatus comprising:
a current sensor element adapted to measure an electrical current, Im, flowing through the protective fuse in a current path to said load;
a determination unit adapted to determine one or more failure indicators, FIs, which are adapted to indicate a possible failure of the protective fuse on the basis of the electrical current, Im, measured by said current sensor element; and
a failure detection unit adapted to detect automatically a failure of the protective fuse if the determined at least one failure indicator, FI, indicates a possible failure of the protective fuse and if the electrical current, Im, measured by the current sensor element has stopped (Im=0) to flow through said protective fuse or is below a predefined current threshold value (Im<Imth).

In a possible embodiment of the fuse failure detection apparatus according to the present invention the at least one failure indicator comprises
a first failure indicator, FI1, comprising a calculated Ampere square seconds (I2t) value indicating a thermal energy generated in the protective fuse exceeding a predefined threshold value,
a second failure indicator, FI2, comprising a measured electrical current, Im, exceeding a predefined rated cur-rent, IR, of the protective fuse; and
a third failure indicator, FI3, comprising a current increase (dI/dt) of the measured electrical current, Im, exceeding a predefined current increase (dI/dtmax).

In a possible embodiment of the fuse failure detection apparatus according to the present invention each failure indicator, FI, comprises a failure indicator flag, FIF, being set or reset within a predefined evaluation cycle in response to the electrical current, Im, measured by the current sensor element within the predefined evaluation cycle.

In a possible embodiment of the fuse failure detection apparatus according to the present invention the failure indicator flags, FIFs, of the failure indicators, FI, being set or reset in an evaluation cycle, EC, are stored in a corresponding register for the next evaluation cycle.

In a possible embodiment of the fuse failure detection apparatus according to the present invention further comprises a calculation unit adapted to process the stored failure indicator flags, FIFs, of the failure indicators to calculate a confidence level indicating a total likelihood that the protective fuse has failed.

In a possible embodiment of the fuse failure detection apparatus according to the present invention a failure of the protective fuse is determined if the calculated confidence level exceeds a predefined confidence level threshold and if the electrical current, Im, measured by the current sensor element has stopped to flow through said protective fuse or is below a predefined current threshold value (Im<Imth).

In a possible embodiment of the fuse failure detection apparatus according to the present invention the confidence level indicating a total likelihood that the protective fuse has failed is calculated by the calculation unit depending on the logical value of failure indication flags, FIFs, and depending on at least one external state signal.

In a possible embodiment of the fuse failure detection apparatus according to the present invention the external state signal comprises a switching state signal (SWSS) which indicates that the associated load has not been switched off externally by a protective switch.

In a possible embodiment of the fuse failure detection apparatus according to the present invention the failure indicators comprise multilevel failure indicators.

In a possible embodiment of the fuse failure detection apparatus according to the present invention the first failure indicator, FI1, and the second failure indicator, FI2, are scaled depending on a number, k, of parallel current paths connected to multiple loads.

In a possible embodiment of the fuse failure detection apparatus according to the present invention the calculation unit is adapted to calculate an average electrical current, Imavg, on the basis of the measured electrical currents, Im, flowing through parallel current paths to the one or more loads, wherein the calculated average electrical current, Imavg, is used as the predefined current threshold (Imth).

In a possible embodiment of the fuse failure detection apparatus according to the present invention the failure detection unit is adapted to generate automatically a fuse failure detection signal (FFDS) indicating a likely failure of the protective fuse due to a short circuit current if the at least one failure indicator indicates a possible failure of the protective fuse and if the electrical current, Im, measured by the current sensor element has stopped to flow through the protective fuse (Im=0) or if the electrical current, Im, measured by the current sensor element is below a predefined current threshold value (Im<Imth).

In a possible embodiment of the fuse failure detection apparatus according to the present invention the determination unit is adapted to calculate an Ampere squared seconds (I2t) value representing a thermal energy generated at the protective fuse in response to the electrical current, Im, measured by the current sensor element and wherein the failure detection unit is adapted to compare the calculated Ampere square seconds (I2t) value with a predetermined Ampere square seconds (I2t) value to generate a fuse failure detection signal (FFDS), if the determined thermal energy has exceeded a predetermined threshold value and the electrical current, Im, measured by the current sensor element has stopped to flow through said protective fuse and if a received switching state signal (SWSS) indicates that the at least one associated load has not been switched off externally by a protective switch.

In a possible embodiment of the fuse failure detection apparatus according to the present invention the determination unit is further adapted to determine an energy input into said protective fuse caused by the flowing electrical cur-rent, Im, if the determined thermal energy does not exceed the predetermined threshold value but the amplitude of the measured electrical current, Im, is higher than a predetermined rated current (IR).

In a possible embodiment of the fuse failure detection apparatus according to the present invention the failure detection unit is adapted to generate an overload failure warning signal (OFWS), if the determined energy input into the protective fuse by the electrical current, I, exceeds a predetermined threshold value, wherein the generated overload failure warning signal (OFWS) indicates an imminent failure of the protective fuse due to an overload current.

In a possible embodiment of the fuse failure detection apparatus according to the present invention the determination unit is adapted to determine an energy input into the protective fuse by calculating a heat transfer balance for the protective fuse as a difference between heat generated by the electrical current, I, flowing through the protective fuse and heat dissipated by the protective fuse.

In a possible embodiment of the fuse failure detection apparatus according to the present invention the current sensor component is adapted to measure an electrical DC current and/or is adapted to measure an electrical AC current flowing through the corresponding current path.

In a possible embodiment of the fuse failure detection apparatus according to the present invention the current sensor element is serially connected to the protective fuse within a current supply path or branch of the load or is attached to the current supply path or current supply branch of the load.

In a possible embodiment of the fuse failure detection apparatus according to the present invention the failure detection unit comprises an interface to receive external state signals, in particular from a protective switch which is connected in series with the protective fuse along the current supply path of the load.

In a possible embodiment of the fuse failure detection apparatus according to the present invention comprises a user interface adapted to output a failure warning signal, momentary states of the failure indicators and of the state signals and to output a confidence level indicating a total likelihood that the protective fuse has failed calculated by a calculation unit depending on the logical values of failure indication flags of the failure indicators and depending on at least one external state signal.

The invention provides according to a further aspect an adapter device comprising a fuse failure detection apparatus according to an aspect to the present invention.

In a possible embodiment of the method according to the first aspect of the present invention, a fuse failure detection signal is automatically generated if the determined thermal energy has exceeded the predetermined threshold value and the electrical current measured by the current sensor element has stopped to flow through said protective fuse. The generated fuse failure detection signal indicates a likely failure of the protective fuse due to a short circuit current. Determining the fuse failure by comparing $I^2t$ values can also cover overload events, in particular if the multilevel comparison approach by several $I^2t$ limit lines is chosen.

This has the advantage that the fuse failure detection signal can be supplied to a local or remote controller and can be considered for controlling functions of the distributed system including the protective load.

In a further possible embodiment of the method according to the first aspect of the present invention, the thermal energy is calculated as an Ampere squared seconds value and compared with the predetermined threshold value.

This has the advantage that an Ampere squared seconds value used as a threshold value can be derived from a data sheet of the protective fuse.

In a further possible embodiment of the method according to the first aspect of the present invention, a failure of the protective fuse is detected, if as a further condition a received switching state signal indicates that the associated load has not been switched off externally by a protective switch.

This has the advantage that in a scenario where a protective switch being connected in series with the protective fuse has been tripped by an external control signal leading to a stop of the flow of an electrical current through the protective fuse does not cause a generation of a fuse failure detection signal which could be wrongly interpreted as a failure of the protective fuse.

In a further possible embodiment of the method according to the first aspect of the present invention, if the determined thermal energy does not exceed the predetermined threshold value but the amplitude of the measured electrical current is higher than a predetermined rated current, an energy input into said protective fuse caused by a flowing electrical current is determined.

In a further possible embodiment of the method according to the first aspect of the present invention, if the determined energy input into the protective fuse by the electrical current does exceed a predetermined threshold value, an overload failure warning signal indicating an imminent failure of the protective fuse due to an overload current is automatically generated.

This provides the significant advantage that an imminent failure of the protective fuse is detected before it actually happens. This allows for instance for performing a preemptive maintenance of the distributed system which comprises the protective fuse. For instance, if the protective fuse has been damaged because of an overload current a possible failure of the protective fuse can be forecast and corresponding countermeasures can be initiated before the protective fuse fails completely.

In a further possible embodiment of the method according to the first aspect of the present invention, the energy input into the protective fuse is determined by calculating a heat transfer balance for the protective fuse as a difference between heat generated by the electrical current flowing through the protective fuse and heat dissipated by the protective fuse.

The invention provides according to a further aspect a fuse failure detection apparatus comprising the features of claim 8.

The invention provides according to the second aspect a fuse failure detection apparatus provided for detection of a failure of a protective fuse used to protect an associated load against overcurrent and/or against overload, wherein the fuse failure detection apparatus comprises:
  a current sensor element adapted to measure an electrical current flowing through the protective fuse to said load,
  a determination unit adapted to determine a thermal energy generated at the protective fuse depending on the electrical current measured by said current sensor element and
  a failure detection unit adapted to detect automatically a failure of the protective fuse if the determined thermal energy exceeds a predetermined threshold value and if the electrical current measured by said current sensor element has stopped to flow through said protective fuse.

In a possible embodiment of the fuse failure detection apparatus according to the second aspect of the present invention, the failure detection unit is adapted to generate automatically a fuse failure detection signal indicating a likely failure of the protective fuse due to a short circuit current if the determined thermal energy has exceeded the predetermined threshold value and if the electrical current measured by the current sensor element has stopped to flow through said protective fuse.

In a further possible embodiment of the fuse failure detection apparatus according to the second aspect of the present invention, the determination unit is adapted to calculate an Ampere squared seconds value representing the thermal energy generated at the protective fuse in response to the electrical current measured by the current sensor element.

In a further possible embodiment of the fuse failure detection apparatus according to the second aspect of the present invention, the failure detection unit is adapted to compare the calculated Ampere squared seconds value with a predetermined Ampere squared seconds value to generate the fuse failure detection signal, if the determined thermal energy has exceeded the predetermined threshold value and the electrical current measured by the current sensor element has stopped to flow through said protective fuse and if a received switching state signal indicates that the associated load has not been switched off externally by a protective switch.

In a further possible embodiment of the fuse failure detection apparatus according to the second aspect of the present invention, the determination unit is further adapted to determine an energy input into said protective fuse caused by the flowing electrical current, if the determined thermal energy does not exceed the predetermined threshold value but the amplitude of the measured electrical current is higher than a predetermined rated current.

In a still further possible embodiment of the fuse failure detection apparatus according to the second aspect of the present invention, the failure detection unit is adapted to generate an overload failure warning signal, if the determined energy input into the protective fuse by the electrical current exceeds a predetermined threshold value, wherein the generated overload failure warning signal indicates an imminent failure of the protective fuse due to an overload current.

In a still further possible embodiment of the fuse failure detection apparatus according to the second aspect of the present invention, the determination unit is adapted to determine the energy input into the protective fuse by calculating a heat transfer balance for the protective fuse as a difference between heat generated by the electrical current flowing through the protective fuse and heat dissipated by the protective fuse.

In a possible embodiment of the fuse failure detection apparatus according to the second aspect of the present invention, the current sensor component is adapted to measure an electrical DC current.

In a still further possible alternative embodiment of the fuse failure detection apparatus according to the second aspect of the present invention, the current sensor component is adapted to measure an electrical AC current.

In a still further possible embodiment of the fuse failure detection apparatus according to the second aspect of the present invention, the current sensor element is serially connected to the protective fuse within the current supply path of the load or is attached to the current supply path of the load.

In a possible implementation, the current sensor element attached to the current supply path of the load can also be moved along the wire or a bar of the current supply path.

In a still further possible embodiment of the fuse failure detection apparatus according to the second aspect of the present invention, the failure detection unit comprises an interface to receive a switching state signal from a protective switch which is connected in series with the protective fuse along the current supply path of the load.

The invention provides according to a further aspect an adapter device comprising a fuse failure detection apparatus according to the second aspect of the present invention.

BRIEF DESCRIPTION OF FIGURES

In the following, possible embodiments of the different aspects of the present invention are described in more detail with reference to the enclosed figures.

FIG. 2 shows a flowchart of the main steps of a possible exemplary embodiment of a method for detection of a failure of a protective fuse according to a further aspect of the present invention;

FIG. 3 shows a further flowchart for illustrating a possible exemplary embodiment of a method for detection of a failure of a protective fuse according to an aspect of the present invention;

DETAILED DESCRIPTION OF EMBODIMENTS

Figure 1:
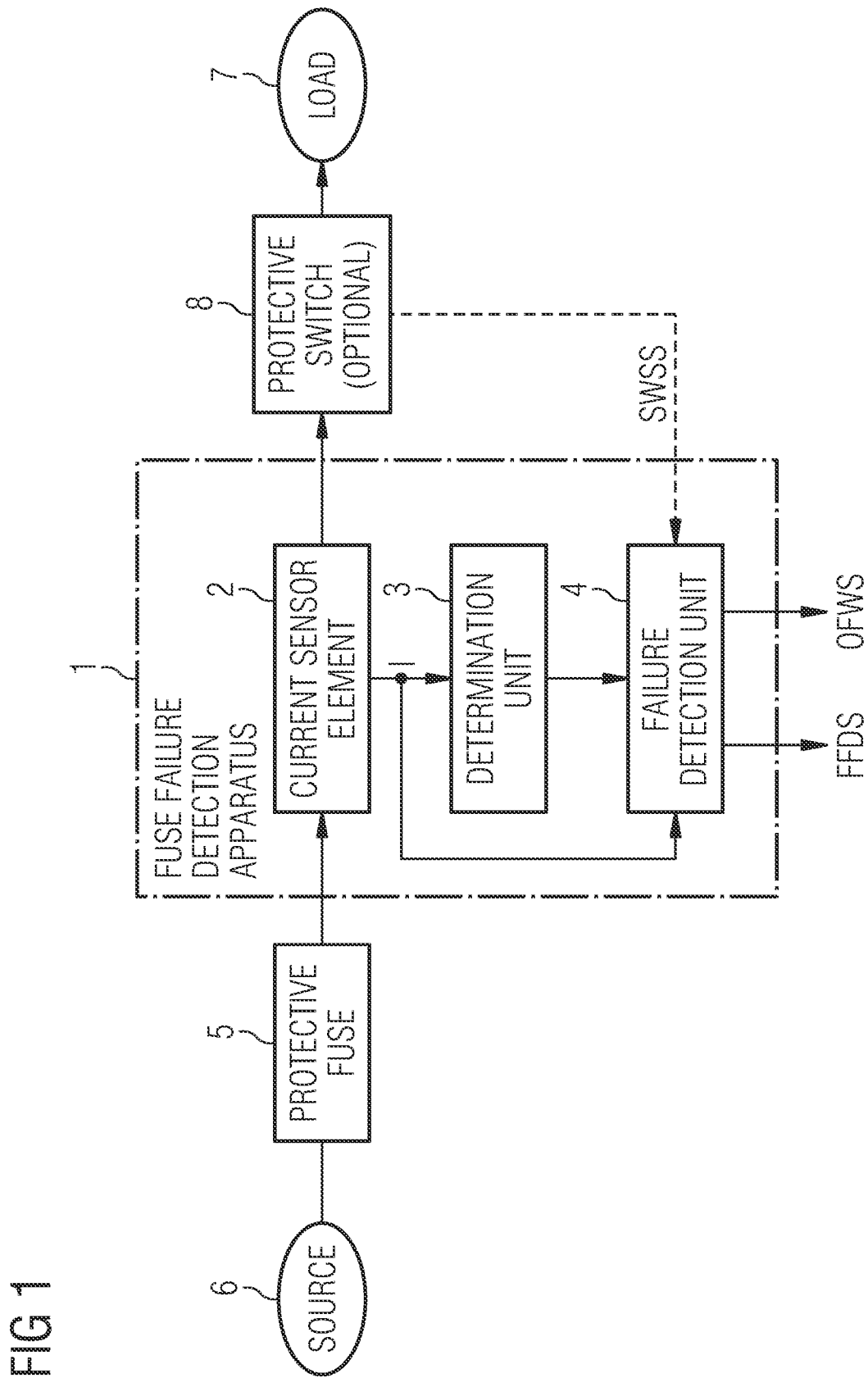
FIG. 1 shows a block diagram for illustrating a possible exemplary embodiment of a fuse failure detection apparatus according to an aspect of the present invention.

As can be seen from the schematic block diagram of FIG. 1, the fuse failure detection apparatus 1 according to the present invention can comprise three main components. In the illustrated embodiment, the fuse failure detection apparatus 1 comprises a current sensor element 2, a determination unit 3 and a failure detection unit 4. The fuse failure detection apparatus 1 is connected in series with the protective fuse 5 as illustrated in FIG. 1. In a possible embodiment, the fuse failure detection apparatus 1 can be connected in series in a current supply path between an electrical source 6 and an electrical load 7 as shown in FIG. 1. In a possible embodiment, the current supply path may also include an optional protective switch 8 as also illustrated in the block diagram of FIG. 1. The electrical load 7 can comprise a resistive load, a capacitive load or an inductive load.

The current sensor element 2 can in a possible embodiment be connected in series to the protective fuse 5 within the current supply path of the load 7. The current supply path can be adapted to carry a DC supply current or an AC supply current. In a possible embodiment, the current sensor element 2 can also be attached to the current supply path of the load 7. In this embodiment, the current sensor element 2 can for instance be clipped on an electrical wire transporting the electrical current flowing through the protective fuse 5 and through the protective switch 8 to the load 7. The electrical current causes a magnetic field which can be detected by the current sensor element 2 attached to the current transporting wire or current transporting busbar. This embodiment has the additional advantage that the current sensor element 2 can be moved along the current supply path between the source 6 and the load 7. Accordingly, the current sensor element 2 attached to the current supply path can also be manually fixed at different locations onto the current transporting wire between the source 6 and the load 7. This provides for more flexibility when extending an existing power distribution system by adding a fuse failure detection apparatus 1 according to the present invention to the respective system. In other words, this embodiment does not require to interrupt an existing current transport wire between the protective fuse 5 and the electrical load 7.

In the embodiment illustrated in FIG. 1, the fuse failure detection apparatus 1 is provided behind the protective fuse 5, i.e., on the output side of the protective fuse 5 at its load facing side. In an alternative embodiment, the fuse failure detection apparatus 1 according to the present invention can also be located on the side of the protective fuse 5 facing the electrical source 6.

In a possible embodiment, the current sensor component 2 illustrated in FIG. 1 can be adapted to measure an electrical DC current provided by the electrical source 6 and supplied to the electrical load 7 via the current supply path. In an alternative embodiment, the current sensor element 2 is adapted to measure an electrical AC current flowing from an electrical AC current source 6 via the current supply path to the electrical load 7.

The current sensor element 2 can comprise in a possible implementation a shunt resistor which is connected serially to the protective fuse 5 within the current supply path of the load 7. The voltage along the shunt resistor is directly proportional to the electrical current flowing through the shunt resistor.

In an alternative embodiment, the current sensor element 2 may comprise a coil, in particular a Rogowski coil, which is adapted to measure alternating electrical currents or high-speed current pulses. The Rogowski coil can respond to fast-changing electrical currents around several nanoseconds because of its low inductance.

The current sensor element 2 can also comprise other kinds of current sensor elements, in particular a Hall-effect current sensors or giant magnetoresistance GMR sensors. A Hall-effect sensor is adapted to measure the magnitude of a magnetic field which can be caused by the electrical current flowing along the current supply path. Consequently, in a possible embodiment, the attachment of a current sensor element 2 to the current supply path does not require a galvanic connection. In such an embodiment, the fuse failure detection apparatus 1 is galvanically isolated from the current supply path between the source 6 and the load 7. This increases the operational reliability of the fuse failure detection apparatus 1 in case that high short circuit overcurrents do occur. Further, an extension of an existing power distribution system can be facilitated since the current sensor element 2 is only mechanically attached to the current supply path to measure the magnetic field without requiring the interruption of the current supply path when mounting the fuse failure detection apparatus 1 to the current transporting wire between the protective fuse 5 and the load 7.

As can be seen from the block diagram of FIG. 1, the fuse failure detection apparatus 1 does not require a tapping of the electrical potential on both sides of the protective fuse 5. The fuse failure detection apparatus 1 according to the present invention is either provided on the upstream side of the protective fuse 5 facing the electrical source 6 or the downstream side of the protective fuse 5 facing the electrical load 7.

The current sensor element 2 measures the electrical current I flowing through the protective fuse 5 and notifies the measured electrical current I to the determination unit 3 of the fuse failure detection apparatus 1 as illustrated in FIG. 1. The determination unit 3 is adapted to determine a thermal energy generated at the protective fuse 5 depending on the electrical current I measured by the current sensor element 2. In a possible embodiment, the determination unit 3 is adapted to calculate an Ampere square seconds value representing the thermal energy generated at the protective fuse 5 in response to the electrical current I measured by the current sensor element 2.

The fuse failure detection apparatus 1 further comprises a failure detection unit 4 adapted to detect automatically a failure of the protective fuse 5, if the determined thermal energy does exceed a predetermined threshold value and if the electrical current measured by the current sensor element 2 has stopped to flow through the protective fuse 5.

The failure detection unit 4 is adapted to generate in a possible embodiment automatically a fuse failure detection signal FFDS indicating a likely failure of the protective fuse 5 due to a short circuit current, if the determined thermal energy has exceeded the predetermined threshold value and if the electrical current I measured by the current sensor element 2 has stopped to flow through the protective fuse 5. In a possible embodiment, the failure detection unit 4 is adapted to compare the calculated Ampere squared seconds value with a predetermined Ampere squared seconds value to generate the fuse failure detection signal FFDS, if the determined thermal energy has exceeded the predetermined threshold value and if the electrical current I measured by the current sensor element 2 has stopped to flow through the protective fuse 5.

The I2t rating is related to the amount of energy let through by a fuse element when it clears the electrical fault. This term is normally used in short circuit conditions and the values can be used to perform co-ordination in electrical networks. I2t parameters can be provided by charts in manufacturer data sheets for different fuse types. For coordination of fuse operation with upstream or downstream devices, both melting I2t and clearing I2t are specified. The melting I2t is proportional to the amount of energy required to begin melting the fuse element. The clearing I2t is proportional to the total energy let through by the fuse when clearing a fault. The energy is mainly dependent on current and time for fuses as well as the available fault level and system voltage. Since the I2t rating of the fuse is proportional to the energy it lets through, it is a measure of the thermal damage from the heat and magnetic forces that will be produced by a fault.

In a possible embodiment, the failure detection unit 4 generates the fuse failure detection signal FFDS only, if an additional condition is met, i.e., if a received switching state signal SWSS indicates that the associated load 7 has not been switched off externally by an associated protective switch 8 provided within the current supply path. In this embodiment, the failure detection unit 4 can comprise an interface to receive a switching state signal SWSS from the protective switch 8 which is connected in series with the protective fuse 5 along the current supply path of the load 7. The protection switch 8 can comprise an electromechanical protective switch and/or a semiconductor protective switch.

In a possible embodiment, the failure detection unit 4 is further adapted to generate an overload failure warning signal OFWS if the determined energy input into the protective fuse 5 by the electrical current flowing along the current supply path does exceed a predetermined threshold value. The generated overload failure warning signal OFWS can indicate an imminent, i.e., a future, failure of the protective fuse 5 due to an overload current. In a possible embodiment, the determination unit 3 can determine an energy input into the protective fuse 5 by calculating a heat transfer balance for the protective fuse 5 as a difference between heat generated by the electrical current I flowing through the protective fuse 5 and heat dissipated by the protective fuse 5. Accordingly, if the determined thermal energy does not exceed the predetermined threshold value but the current of the measured electrical current I is higher than a predetermined rated electrical current, an energy input into the protective fuse 5 caused by the flowing electrical current I can be determined. If this energy input does exceed a predefined threshold value, the overload failure warning signal OFWS can be generated by the failure detection unit 4 and output via an interface of the fuse failure detection apparatus 1. In the illustrated embodiment of FIG. 1, the fuse failure detection apparatus 1 comprises a data interface which is provided to output the generated fuse failure detection signal FFDS and the overload failure warning signal OFWS. The fuse failure detection signal FFDS indicates a failure of the protective fuse 5 due to a short circuit current. In this scenario, the protective fuse 5 has already been broken or melted because of the very high short circuit overcurrent. In contrast, the overload failure warning signal OFWS does indicate a possible future failure of the protective fuse 5 due to an overload current flowing along the current supply path.

Both the fuse failure detection signal FFDS and the overload warning signal OFWS can be supplied to a local or remote controller to trigger automatically countermeasures. In case that a fuse failure detection signal FFDS is received by the local or remote controller, the protective fuse 5 which has been broken because of the short circuit current has to be replaced. In case that the remote or local controller receives the overload failure warning signal OFWS, the protective fuse 5 is still operative but might be damaged by the flowing overload current requiring replacement by a maintenance operator in the near future. The overload failure warning signal OFWS provides a warning about a possible future function failure of the protective fuse 5 and can in a possible embodiment trigger automatically a preemptive maintenance operation of the distributed system.

In the illustrated embodiment, the fuse failure detection apparatus 1 can comprise a control interface to receive a switching state signal SWSS from the protective switch 8 which can be connected in series to the protective fuse 5 within the current supply path. The protection switch 8 can be a separate element, in particular a semiconductor device such as an insulated gate bipolar transistor IGBT, a metal oxide semiconductor field effect transistor MOSFET or other semiconductor switching devices such as a bipolar junction transistor BJT or a junction gate field effect transistor JFET. Other possible embodiments comprise a thyristor or an integrated gate-commutated thyristor IGCT. As soon as the protective switch 8 has switched off the electrical load 7, the switching state signal SWSS can be set to logical high indicating that the associated load 7 has been switched off by the protection switch 8. As long as the switching state signal SWSS is logical low and indicates that the associated load has not been switched off externally by the protective switch 8, the failure detection unit 4 can automatically generate the fuse failure detection signal FFDS, if the determined thermal energy has exceeded the predetermined threshold value and it is detected by the failure detection unit 4 that the electrical current measured by the current sensor element 2 has stopped to flow through the protective fuse 5. In this embodiment, the failure detection unit 4 can monitor the amplitude of the electrical flow measured by the current sensor element 2. If the amplitude of the electrical current drops to zero the failure detection unit 4 can determine that the electrical current I has stopped to flow through the protective fuse 5. Consequently, in a preferred embodiment, the failure detection unit 4 generates the fuse failure detection signal FFDS only if three conditions are met. A first condition is that the calculated Ampere squared seconds value has exceeded a predetermined Ampere squared seconds value. A second condition is that the electrical current I flowing through the protective fuse 5 and measured by the current sensor element 2 has stopped to flow. A third condition is that the received switching state signal SWSS does indicate that no switch-off has been performed by the protective switch 8, e.g., the received switching state signal SWSS is logically low.

In a possible implementation of the fuse failure detection apparatus 1, the current sensor element 2, the determination unit 3 and the failure detection unit 4 can be integrated in a housing of a corresponding device. In an alternative embodiment, the different units of the fuse failure detection apparatus 1, in particular the determination unit 3 and the failure detection unit 4, can be distributed in different locations within the power distribution system. In a still further possible embodiment, the housing of the fuse failure detection apparatus 1 may also include the protective switch 8 as illustrated in the block diagram of FIG. 1.

FIG. 2 shows a flowchart for illustrating a possible exemplary embodiment of a method for detection of a failure of a protective fuse such as the protective fuse 5 illustrated in the block diagram of FIG. 1. In the illustrated embodiment, the method comprises three main steps $S_A$, $S_B$, $S_C$.

The invention provides according to an aspect a method for detection of a fuse failure of a protective fuse 5 used to protect at least one associated load 7 against overcurrent and/or against overload, the method comprising the steps of:
measuring in step $S_A$ an electrical current, Im, flowing through the protective fuse 5 in a current path to said load 7 by means of a current sensor element 2;
determining in step $S_B$ one or more failure indicators FIs each adapted to indicate a possible failure of the protected fuse 5 on the basis of the measured electrical current, Im; and detecting in step $S_C$ automatically a failure of the protective fuse 5 if the determined at least one failure indicator FI indicates a possible failure of the protective fuse 5 and if the electrical current, Im, measured by the current sensor element 2 has stopped (Im=0) to flow through said protective fuse 5 or is below a predefined current threshold value (Im<Imth).

An advantage of the method according to the present invention is that it operates reliably even in a harsh environment. The possibility of galvanic isolation provides a great advantage here. Consequently, the voltage level and overvoltage events can be safely kept apart of user and the logic equipment. Furthermore, the evaluation circuit can be kept away from extreme environment conditions.

A further advantage of the method according to the present invention is that failure of a protective fuse 5 can be detected very fast within a short detection time of less than one millisecond.

In a possible embodiment of the method according to the present invention a first failure indicator FI1 comprises a calculated Ampere squared seconds (I2t) value indicating a thermal energy generated in the protective fuse 5 exceeding a predefined threshold value.

In a possible embodiment of the method according to the present invention a second failure indicator FI2 comprises a measured electrical current, Im, exceeding a predefined rated current, IR, of the protective fuse 5.

In a possible embodiment of the method according to the present invention a third failure indicator FI3 comprises a current increase or a current slope (dI/dt) of the measured electrical current, Im, exceeding a predefined current increase (dI/dt max).

In a possible embodiment of the method according to the present invention each failure indicator FI comprises a failure indicator flag FIF being set or reset within a predefined evaluation cycle EC in response to the electrical current, Im, measured by the current sensor element 2 within the predefined evaluation cycle EC. In a possible embodiment of the method according to the present invention logical values of the failure indicator flags FIFs of the failure indicators FI set or reset in an evaluation cycle EC are stored in a register for the next evaluation cycle.

In a possible embodiment of the method according to the present invention the logical values of the failure indicator flags FIFs of the failure indicators FIs are processed by a calculation unit of the fuse failure detection apparatus 1 to calculate a confidence level CONF-LEV indicating a total likelihood that the protective fuse 5 has failed. In a possible embodiment of the method according to the present invention a failure of the protective fuse 5 is determined by the determination unit 3 of the fuse failure detection apparatus 1, if the calculated confidence level CONF-LEV exceeds a predefined confidence level threshold and if the electrical current, Im, measured by the current sensor element 2 has stopped to flow through said protective fuse 5 or is below a predefined current threshold value (Im<Imth).

In a possible embodiment of the method according to the present invention the confidence level CONF-LEV indicating a total likelihood that the protective fuse 5 has failed is calculated depending on the logical values of failure indicator flags FIFs and/or depending on at least one external state signal. Also, the amplitude of the input voltage is one possible external signal which can be monitored.

In a possible embodiment of the method according to the present invention the external state signal comprises a switching state signal (SWSS) which indicates that the associated load 7 has not been switched off externally by a protective switch 8.

In a possible embodiment of the method according to the present invention the failure indicators FIs comprise multi-level failure indicators.

In a possible embodiment of the method according to the present invention the first failure indicator FI1 and the second failure indicator FI2 are scaled depending on a number, k, of parallel current paths connected to multiple loads 7. The idea is to monitor k fused branches, i.e., current supply paths with only one supervision unit 1 according to the present invention.

In a possible embodiment of the method according to the present invention an average electrical current, Imavg, is calculated by the calculation unit on the basis of the measured electrical currents, Im, flowing through parallel current paths to the load 7 and is used as a predefined current threshold (Imth).

In a possible embodiment of the method according to the present invention if the determined thermal energy indicated by the calculated Ampere squared seconds (I2t) value does not exceed the predefined threshold value but the amplitude of the measured electrical current, Im, is higher than a pre-determined rated current, IR, an energy input into said protective fuse 5 caused by a flowing electrical current is determined.

In a possible embodiment of the method according to the present invention if the determined energy input into the protective fuse 5 by the electrical current exceeds a predetermined threshold value, an overload failure warning signal (OFWS) indicating an imminent failure of the protective fuse 5 due to an overload current is automatically generated.

In a possible embodiment of the method according to the present invention the energy input into the protective fuse 5 is determined by calculating a heat transfer balance for the protective fuse 5 as a difference between heat generated by the electrical current flowing through the protective fuse 5 and heat dissipated by the protective fuse 5.

The invention provides according to a further aspect a fuse failure detection apparatus 1 provided for detection of a failure of a protective fuse 5 used to protect an associated load 7 against overcurrent and/or against overload as illustrated in the block diagram of FIG. 1. The fuse failure detection apparatus 1 comprises a current sensor element 2 adapted to measure an electrical current, Im, flowing through the protective fuse 5 in a current path to said load 7. The fuse failure detection apparatus 1 also comprises a determination unit 3 adapted to determine one or more failure indicators FIs which are adapted to indicate a possible failure of the protective fuse 5 on the basis of the electrical current, Im, measured by said current sensor element 2. The fuse failure detection apparatus 1 further comprises a failure detection unit 4 adapted to detect automatically a failure of the protective fuse 5 if the determined at least one failure indicator FI indicates a possible failure of the protective fuse 5 and if the electrical current, Im, measured by the current sensor element 2 has stopped (Im=0) to flow through said protective fuse 5 or is below a predefined current threshold value (Im<Imth).

In a possible embodiment of the fuse failure detection apparatus 1 according to the present invention as shown in FIG. 1 the at least one failure indicator FI comprises a first failure indicator FI1 comprising a calculated Ampere square seconds (I2t) value indicating a thermal energy generated in the protective fuse 5 exceeding a predefined threshold value, a second failure indicator FI2 comprising a measured electrical current, Im, exceeding a predefined rated current, IR, of the protective fuse 5; and a third failure indicator FI3 comprising a current increase (dI/dt) of the measured electrical current, Im, exceeding a predefined current increase (dI/dtmax).

In a possible embodiment of the fuse failure detection apparatus 1 according to the present invention each failure indicator FI comprises a failure indicator flag FIF being set or reset within a predefined evaluation cycle EC in response to the electrical current, Im, measured by the current sensor element 2 within the predefined evaluation cycle EC. The minimum evaluation cycle comprises two samples from the ADC system. The maximum evaluation cycle can comprise multiple mains periods. For example, an evaluation every 10 ms (half mains period on 50 Hz systems) is performed in a possible embodiment. Further in a possible embodiment a self-adaption of the evaluation cycle can be performed. The higher the stress level, the shorter the evaluation cycle EC can be adjusted.

In a possible embodiment of the fuse failure detection ap-apparatus 1 according to the present invention the failure indicator flags FIFs of the failure indicators FI being set or reset in an evaluation cycle EC are stored in a corresponding register for the next evaluation cycle.

In a possible embodiment of the fuse failure detection apparatus 1 according to the present invention further comprises a calculation unit adapted to process the stored failure indicator flags FIF of the failure indicators FI to calculate a confidence level CONF-LEV indicating a total likelihood that the protective fuse 5 has failed.

In a possible embodiment of the fuse failure detection apparatus 1 according to the present invention a failure of the protective fuse 5 is determined if the calculated confidence level CONF-LEV exceeds a predefined confidence level threshold and if the electrical current, Im, measured by the current sensor element 2 has stopped to flow through said protective fuse 5 or is below a predefined current threshold value (Im<Imth).

In a possible embodiment of the fuse failure detection apparatus 1 according to the present invention the confidence level CONF-LEV indicating a total likelihood that the protective fuse 5 has failed is calculated by the calculation unit depending on the logical value of failure indication flags FIFs and depending on at least one external state signal.

In a possible embodiment of the fuse failure detection apparatus 1 according to the present invention the external state signal comprises a switching state signal (SWSS) which indicates that the associated load 7 has not been switched off externally by a protective switch 8.

In a possible embodiment of the fuse failure detection apparatus 1 according to the present invention the failure indicators FIs comprises multilevel failure indicators.

In a possible embodiment of the fuse failure detection apparatus 1 according to the present invention the first failure indicator FI1 and the second failure indicator FI2 are scaled depending on a number, k, of parallel current paths connected to multiple loads 7.

In a possible embodiment of the fuse failure detection apparatus 1 according to the present invention the calculation unit is adapted to calculate an average electrical current, Imavg, on the basis of the measured electrical currents, Im, flowing through parallel current paths to the load 7 wherein the calculated average electrical current, Imavg, is used as the predefined current threshold (Imth).

In a possible embodiment of the fuse failure detection apparatus 1 according to the present invention the failure detection unit 4 is adapted to generate automatically a fuse failure detection signal (FFDS) indicating a likely failure of the protective fuse 5 due to a short circuit current if the at least one failure indicator FI indicates a possible failure of the protective fuse 5 and if the electrical current, Im, measured by the current sensor element 2 is stopped to flow through the protective fuse 5 (Im=0) or if the electrical current, Im, measured by the current sensor element 2 is below a pre-defined current threshold value (Im<Imth).

In a possible embodiment of the fuse failure detection apparatus 1 according to the present invention the determination unit 3 is adapted to calculate an Ampere squared seconds (I2t) value representing a thermal energy generated at the protective fuse 5 in response to the electrical current, Im, measured by the current sensor element 2 and wherein the failure detection unit 4 is adapted to compare the calculated Ampere square seconds (I2t) value with a predetermined Ampere square seconds (I2t) value to generate a fuse failure detection signal (FFDS), if the determined thermal energy has exceeded a predetermined threshold value and the electrical current, Im, measured by the current sensor element 2 has stopped to flow through said protective fuse 5 and if a received switching state signal (SWSS) indicates that the associated load 7 has not been switched off externally by the protective switch 8.

In a possible embodiment of the fuse failure detection apparatus 1 according to the present invention the determination unit 3 is further adapted to determine an energy input into said protective fuse 5 caused by the flowing electrical current, Im, if the determined thermal energy does not exceed the predetermined threshold value but the amplitude of the measured electrical current, Im, is higher than a predetermined rated current (IR).

In a possible embodiment of the fuse failure detection apparatus 1 according to the present invention the failure detection unit 4 is adapted to generate an overload failure warning signal (OFWS), if the determined energy input into the protective fuse 5 by the electrical current, I, exceeds a predetermined threshold value, wherein the generated overload failure warning signal (OFWS) indicates an imminent failure of the protective fuse 5 due to an overload current.

In a possible embodiment of the fuse failure detection apparatus 1 according to the present invention the determination unit 3 is adapted to determine an energy input into the protective fuse 5 by calculating a heat transfer balance for the protective fuse 5 as a difference between heat generated by the electrical current, I, flowing through the protective fuse 5 and heat dissipated by the protective fuse 5.

In a possible embodiment of the fuse failure detection apparatus 1 according to the present invention the current sensor component 2 is adapted to measure an electrical DC current and/or is adapted to measure an electrical AC current flowing through the corresponding current path.

In a possible embodiment of the fuse failure detection apparatus 1 according to the present invention the current sensor element 2 is serially connected to the protective fuse 5 within a current supply path of the load 7 or is attached to the current supply path of the load 7.

In a possible embodiment of the fuse failure detection apparatus 1 according to the present invention the failure detection unit 4 comprises an interface to receive external state signals, in particular from a protective switch 8 which is connected in series with the protective fuse 5 along the current supply path of the load 7 as shown in FIG. 1.

In a possible embodiment of the fuse failure detection apparatus 1 according to the present invention comprises a user interface UI adapted to output a failure warning signal, momentary states of the failure indicators FIs and of the state signals and to output a confidence level CONF-LEV indicating a total likelihood that the protective fuse 5 has failed calculated by a calculation unit depending on the logical values of failure indication flags FIFs of the failure indicators FIs and depending on at least one external state signal.

The invention provides according to a further aspect an adapter device comprising a fuse failure detection apparatus 1 according to an aspect to the present invention as illustrated in the block diagram of FIG. 1.

The invention provides according to a further aspect a method for detection of a failure of a protective fuse used to protect an associated load 7 against overcurrent and/or against overload, wherein the method comprises the steps of:

measuring in step $S_A$ an electrical current flowing through the protective fuse 5 to said load 7 by means of a current sensor element 2;

determining in step $S_B$ a thermal energy generated in the protective fuse 5 depending on the measured electrical current and detecting in step $S_C$ automatically a failure of the protective fuse 5 if the determined thermal energy exceeds a predetermined threshold value and if the electrical current measured by the current sensor element 2 has stopped to flow through said protective fuse 5.

Accordingly, the used failure indicator FI can be that the determined thermal energy exceeds a predetermined threshold.

In the first step $S_A$, an electrical current flowing through the protective fuse 5 to the load 7 is detected by means of a current sensor element 2. The current sensor element 2 may be integrated in the housing of a fuse failure detection apparatus 1 as illustrated in the block diagram of FIG. 1. The current sensor element 2 can also comprise a separate element connected to the determination unit 3 and the failure detection unit 4 to a sensor signal line. The measured electrical current I may comprise a DC current and/or an AC current.

In the further step $S_B$, a thermal energy generated in the protective fuse 5 depending on the measured electrical current is determined. In a possible embodiment, the thermal energy can be calculated as an Ampere squared seconds value and then compared with a predefined threshold value.

In the further step $S_C$, a failure of the protective fuse 5 is automatically detected, if the thermal energy determined in step $S_B$ receives the predefined threshold value and if as a second condition, the electrical current I measured by the current sensor element 2 in step $S_A$ has stopped to flow through the protective fuse 5. If such a failure is detected, a fuse failure detection signal FFDS can be generated which indicates a likely failure of the protective fuse 5 due to a short circuit current.

FIG. 3 shows a flowchart of a possible embodiment of the method of a failure of a protective fuse 5.

The process starts at step S0. In a further step S1, it is determined whether a current flow can be detected. A current flow is detected if the amplitude of the flowing current I measured by the current sensor component 2 exceeds a predefined threshold value for a predetermined minimum time span. If a current flow has been detected in step S1, an Ampere squared seconds value of the measured electrical current I can be calculated and can be compared in step S2 with a predefined Ampere squared seconds threshold value. This predefined Ampere squared seconds threshold value comprises a parameter which can be set during initialization in a configuration memory of the determination unit 3. In a possible implementation, the Ampere squared seconds threshold value stored in the configuration memory can also be adjusted by a user or operator by means of a user interface or adjusted by an external controller through a data interface of the fuse failure detection apparatus 1. A further parameter which can be set in the configuration register or configuration memory can comprise the rated electrical current visible for the load 7 or the rated current of the fuse type in use. The comparison of the calculated Ampere squared seconds value and the predefined Ampere squared seconds threshold value can be performed in a possible implementation by a comparator of the failure detection unit 4. This can be a hardware comparator or a logic representation inside the program code of a μController. In a possible implementation, the Ampere squared seconds value can be calculated based on the measured current in a possible embodiment for each ten milliseconds. This time period can vary depending on the use case. In a possible embodiment the time period for calculation of the Ampere squared second value is adjustable. If the Ampere squared seconds value does not exceed the predefined threshold value, a further comparison is performed in step S3 as illustrated in the flowchart of FIG. 3. It is determined in step S3 whether the measured electrical current does exceed a predefined rated electrical current which can be read from the configuration memory of the fuse failure detection apparatus 1. If this is not the case, the protective fuse 5 is still in the normal operation range and no critical situation has arisen. In contrast, if the measured electrical current exceeds the predefined rated current, an energy input into the protective fuse 5 caused by the flowing electrical current I can be calculated or determined in step S4. In a possible embodiment, the determination unit 3 determines in step S4 an energy input into the protective fuse 5 by calculating a heat transfer balance for the protective fuse 5. The heat transfer balance comprises a difference between heat generated by the electrical current I flowing through the protective fuse 5 and heat dissipated by the protective fuse 5. If the energy input into the protective fuse 5 by the electrical current I does exceed a predefined threshold value, the failure detection unit 4 can generate in a preferred embodiment in step S4 an overload failure warning signal OFWS which indicates a possible imminent failure of the protective fuse 5 due to an overload current.

Accordingly, the overload failure warning signal OFWS is generated in a situation where the thermal energy represented by the calculated Ampere squared seconds value does not exceed a predefined threshold but the electrical current flowing through the protective fuse 5 is higher than a predefined rated electrical current, i.e., in an overload current situation. In a preferred embodiment, the overload failure warning signal OFWS is generated automatically, if the calculated heat transfer balance indicates a critical energy input into the protective fuse 5 causing likely a damage to the protective fuse 5.

In step S5, it is determined whether the electrical current I flowing through the protective fuse 5 and measured by the current sensor element 2 has stopped or not. If the electrical current I is still flowing, the procedure loops back to step S2 as shown in the flowchart of FIG. 3. In contrast, if the monitored electrical current I has stopped to flow, it is decided in step S6 whether the interruption of the electrical current I was caused by an external protective switch such as the protective switch 8 illustrated in the block diagram of FIG. 1. In a possible embodiment, the received switching state signal SWSS is evaluated to decide whether an external switch-off has been performed. If the received switching state signal SWSS indicates an external switch-off, the process loops back to step S1 as illustrated in the flowchart of FIG. 3. However, if the switching state signal SWSS indicates that no external switch-off has been performed, it is concluded in step S7 that the protective fuse 5 has been broken because of a high short circuit current. In this case, the failure detection unit 4 can further generate automatically in step S7 a fuse failure detection signal FFDS indicating a likely failure of the protective fuse 5 due to a short circuit current.

As can be seen from FIG. 3, there are two parameters which can be set externally, i.e., the predetermined Ampere squared seconds threshold value $I^2t_{max}$ and the rated current $I_R$. In a possible implementation, both parameters can be set in an initialization phase. In a further embodiment, the parameters can also be adjusted during operation of the fuse failure detection apparatus 1 via a user or data interface. The data interface may connect the fuse failure detection apparatus 1 with a remote or a local controller which can set the parameters during operation of the distributed power supply system. Further, the rated current $I_R$ can be adapted depending on the load 7 to be protected by the protective fuse 5. In a possible implementation, an allowable rated current $I_R$ can be read from a database or from a local memory integrated in the load 7 to be protected.

The protective fuse 5 comprises fusible elements. These fusible elements inside the protective fuse 5 can melt to protect the downstream load to which the protective fuse 5 is connected. The protective fuse can also be referred to as a sacrificial device in the circuit. The fusible elements within the protective fuse 5 are specially designed to carry a specific amount of electrical current continuously without opening. This is referred to as the rated current $I_R$ of the protective fuse 5. If the electrical current I flows through these element bridges or restrictions of the electrical fuse 5, heat is generated. Until there is a balance in the heat transfer, the fuse elements continue to carry the electrical current as intended. A balance of the heat transfer is achieved where the heat generated equals the heat dissipated.

Figure 4A:
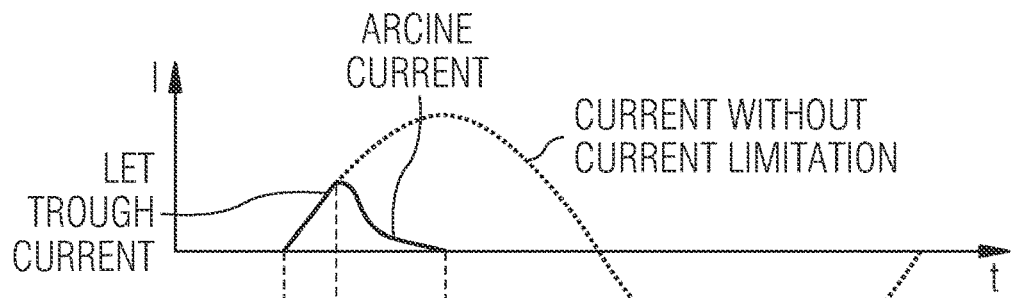
FIGS. 4A, 4B illustrate signal diagrams to illustrate the operation of a protective fuse in a short circuit condition.
Figure 4B:
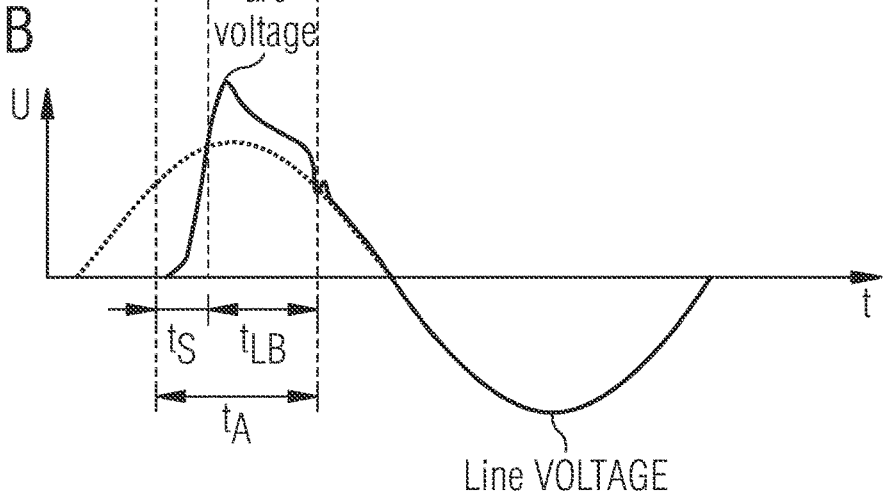

In contrast, if there is an imbalance in the heat transfer due to overcurrent conditions such as an overload or a short circuit occurrence, the amount of heat generated is greater than the heat dissipated. This in turn causes a rise in temperature at the fusible elements of the protective fuse 5 performed by restrictions or weak points. If the rise in temperature does reach a melting point of fusible elements (e.g., 1085° C. for copper or 962° C. for silver), the element bridges within the protective fuse 5 do start to melt and break, resulting in an interruption of electrical current I flowing through the protective fuse 5 to the protected load 7. In the event of a short circuit condition, the fusible elements within the protective fuse 5 begin to melt and then separate in just a few milliseconds the protective load 7 from the electrical source 6. During this time period, an electrical arc can be generated within the fuse 5 as also illustrated in the signal diagrams of FIGS. 4A, 4B.

The thermal energy generated during the interruption of a fault current by the protective fuse 5 can be expressed in Joules and is commonly referred to as the Ampere squared seconds. The thermal energy is proportional to the square of the electrical current I during the operating time t.

The thermal energy generated can be represented as a melting Ampere squared seconds value, an arcing Ampere squared seconds value and a clearing Ampere squared seconds value.

The melting Ampere squared seconds value $I^2t$ is the heat energy passed by the protective fuse 5 after an overcurrent occurs until the fuse element does melt.

The arcing Ampere squared seconds value is the heat energy passed by the protective fuse 5 during its arcing time.

The clearing Ampere squared seconds value is the sum of the melting plus the arcing Ampere squared seconds value.

Figure 5:
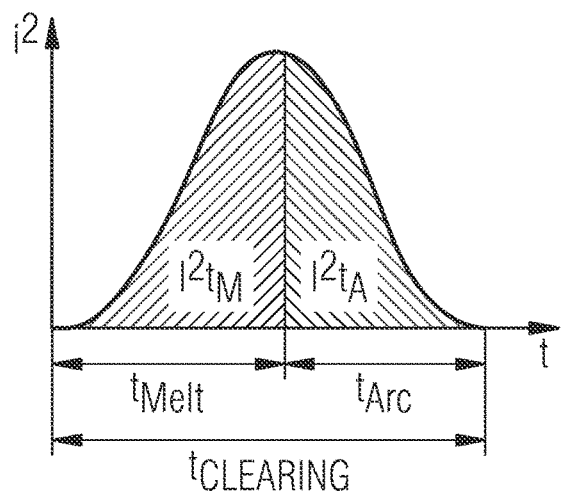
FIG. 5 illustrates a simple diagram for illustrating definitions for an Ampere squared seconds value used to determine a thermal energy within the protective fuse by the method and apparatus according to the present invention.

FIG. 5 illustrates the calculation of an Ampere squared seconds value. There is a melting time and an arcing time. The melting time comprises a time span from the initiation of the overcurrent condition to the time instant when arcing begins inside the protective fuse 5. This is followed by the arcing time, i.e., the time span between the melting of a fuse link until the electrical overcurrent is interrupted. If a point of no return has been reached the protective fuse 5 melts and interrupts the electrical current supply path.

Figure 6:
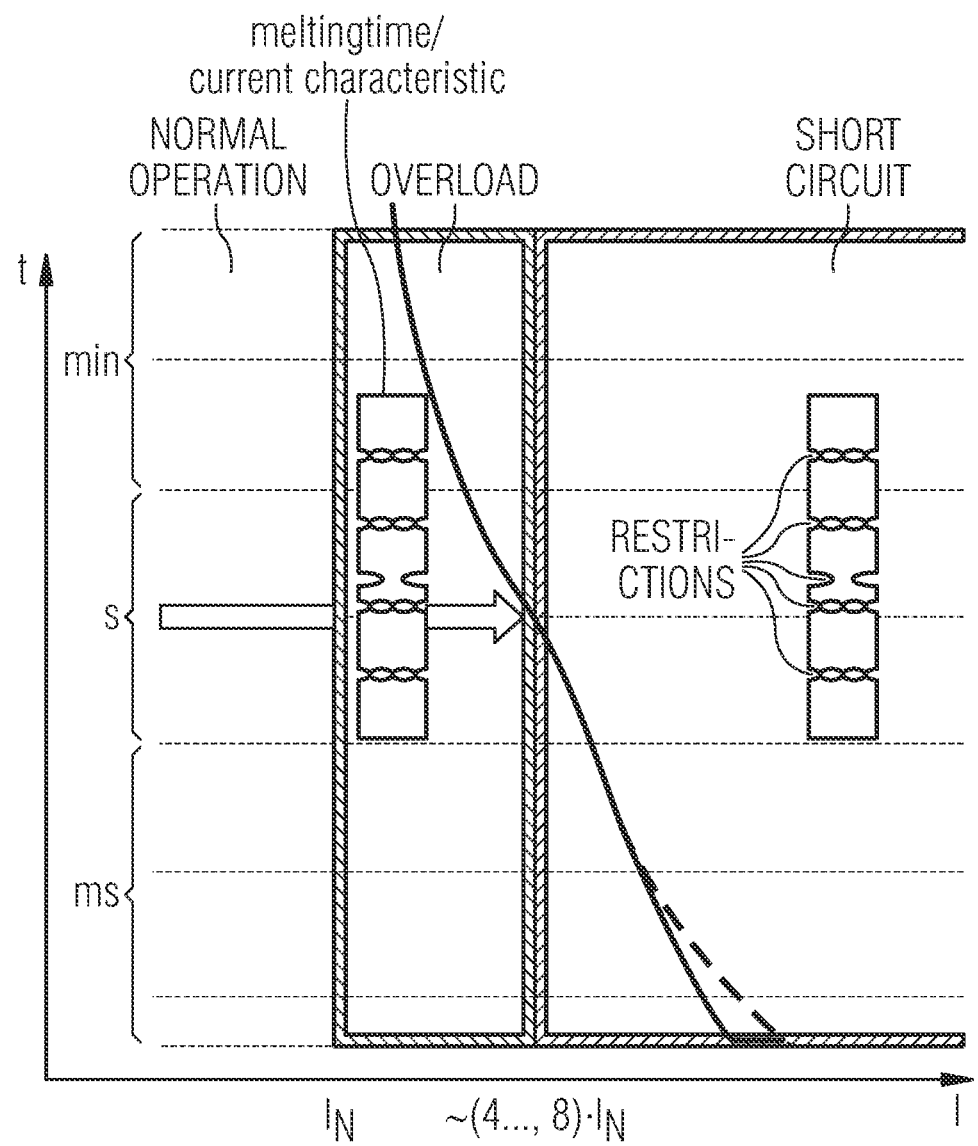
FIG. 6 shows a diagram for illustrating an operation behavior of a protective fuse used to provide protection against overload and/or against overcurrent.

FIG. 6 illustrates the operation of a protective fuse 5 used for a short circuit overcurrent protection and overload current protection.

An overcurrent is any electrical current which is larger than what a connected load, equipment or device is rated to carry under specified conditions. Unless the overcurrent is removed in time, even moderate overcurrents can quickly overheat the system components.

An overload fault condition comprises an overcurrent that is confined to a normal current path. Typically, overcurrents less than 600% of the rated electrical current $I_R$ of the protected load 7 or application are termed as overload fault currents. Overload conditions often arise in applications or systems when temporary surge currents persist in the system, for instance due to a mechanical obstruction or jammed equipment conditions.

Typically, overcurrents greater than 600% of the rated current $I_R$ of the protected device or load are termed as short circuit fault currents. A short circuit condition can arise due to an occurrence such as accidents, misapplications or insulation breakdowns.

FIG. 6 illustrates a diagram showing a characteristic curve of a protective fuse 5. There are three main operation zones of the protective fuse 5. As long as the measured electrical current I is beneath the rated current $I_R$, there is a normal operation behavior and the protective fuse 5 is not affected. If the electrical current I exceeds the predefined rated current $I_R$, in a possible embodiment, lead which is provided at the restrictions or bridges which are made of copper can diffuse into the bridge elements thus reducing the melting temperature of the fuse element bridge. The lowered melting temperature can be for instance 170° C. Accordingly, an overload current leading to diffusion of a substance into the connecting bridge elements can over time cause reduction of the melting temperature and finally to a breaking of the bridge element. In case of a short circuit scenario, very high electrical currents do almost instantly lead to an interruption of the bridging copper-made elements because the initial melting temperature of around 1083° C. for copper is fastly reached.

The determination unit 3 of the fuse failure detection apparatus 1 can determine continuously the thermal energy generated in the protective fuse 5 depending on the electrical current measured by the current sensor element 2. As long as the protective fuse 5 is in the normal operation range, no detection or warning signal is generated. An overload scenario can be detected by monitoring continuously a calculated heat transfer balance.

The heat transfer balance indicates the difference between the heat entry and the heat dissipated by the protective fuse 5.

The heat entry can be calculated as $\Delta Q_+ = R*I^2*\Delta t$.

The dissipated heat can be calculated as $\Delta Q_- = \lambda(T_n - T_0) *\Delta t$, wherein $\Delta t$ is an incremental time unit, $T_0$ is the environmental temperature of e.g., 35° C., $T_n$ is the extrapolated temperature, R is the resistance at the fuse element and I is the electrical current.

$$T_{n+1} = T_n + \Delta T,$$

wherein $\Delta T$ is the temperature difference and can be calculated as follows:

$$\Delta T = (\Delta Q_+ - \Delta Q_-)*C*\Delta t,$$

wherein C is the heat capacity.

The calculation of the heat entry can be performed separately for the lead and the restricted fuse elements of the protective fuse 5. The calculation can be performed by a calculation unit, i.e., a processor or microprocessor.

In a possible embodiment the fuse failure detection apparatus 1 as illustrated in FIG. 1 can further comprise at least one temperature sensor element adapted to measure a momentary temperature T at the protective fuse 5. The measured temperature can be used to verify the calculated extrapolated temperature or for calibration purposes.

In a possible embodiment, the fuse failure detection apparatus 1 can be integrated in other devices. In a possible embodiment, the fuse failure detection apparatus 1 can be integrated in an adapter device. This adapter device can be used to connect an electrical load or an electrical load control device to a wire or a busbar of a power supply system. This adapter device can in a possible embodiment also include a protective switch 8 and the protective fuse 5.

In a further possible embodiment, the fuse failure protection apparatus 1 can also comprise a user interface with a graphical display unit. In this embodiment, the fuse failure detection signal FFDS and/or the overload failure warning signal OFWS can be displayed to an operator of the power supply system to assist the operator in performing necessary countermeasures, if the fuse failure detection signal FFDS or the overload failure warning signal OFWS is displayed to him. The display unit of the user interface can also display the parameters set for the fuse failure detection apparatus 1, in particular the rated current $I_R$ and the predefined Ampere squared seconds threshold value. The method according to the present invention as illustrated in the exemplary flowcharts of FIGS. 2, 3 can be executed in a possible embodiment by a processor or FPGA integrated in the fuse failure detection apparatus 1. The fuse failure detection apparatus 1 can be a mobile handheld apparatus 1 with an integrated current sensor element 2 which can be clipped on a wire or busbar of the power supply path of the load 7.

Figure 7:
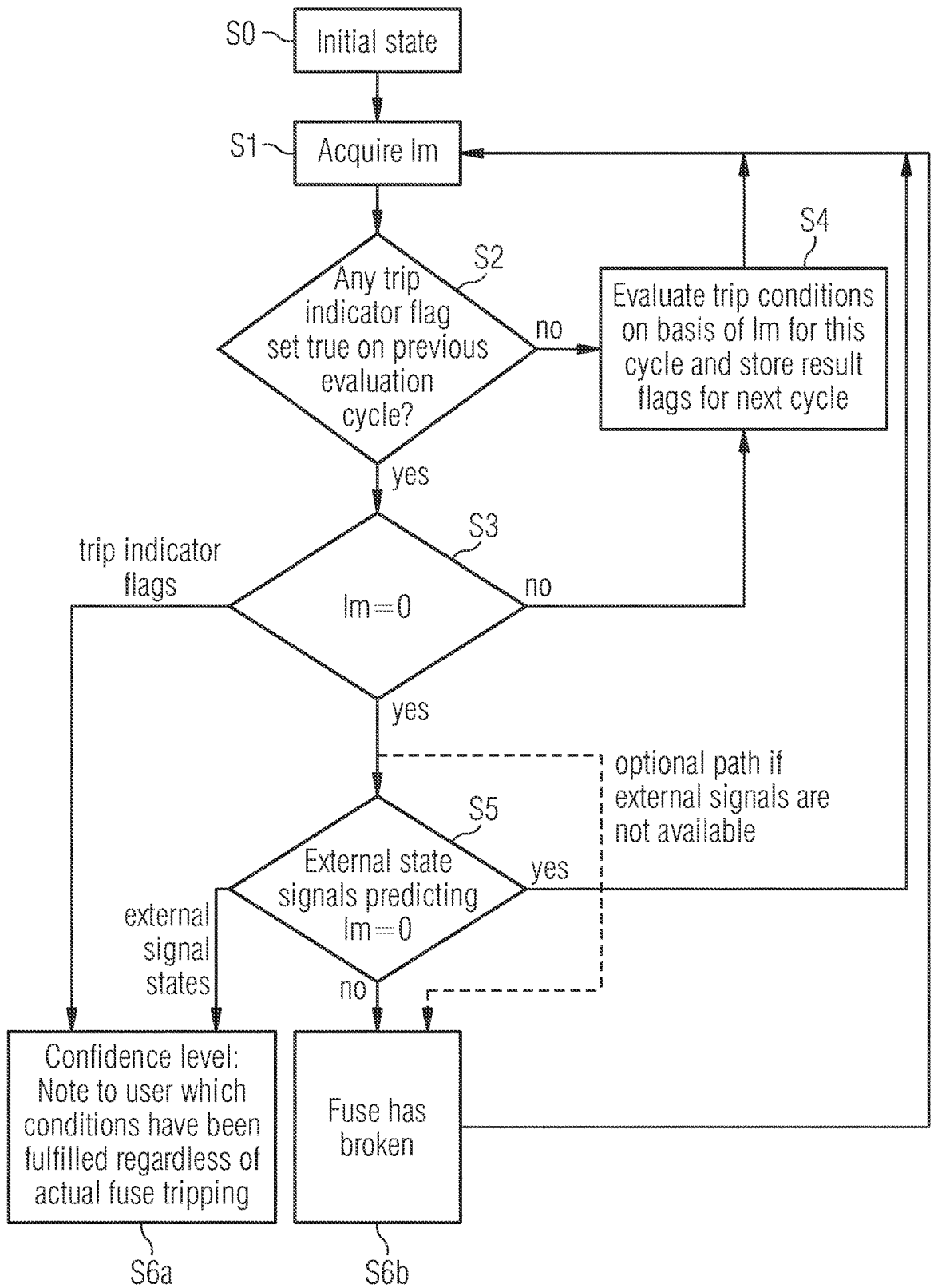
FIG. 7 shows a flowchart of the main steps of a further possible exemplary embodiment of a method for detection of a failure of a protective fuse according the present invention.

FIG. 7 shows a flowchart of main steps of an exemplary embodiment of a method for detection of a failure of a protective fuse 5 according to an aspect of the present invention. It shows a generalized variant of the flowchart illustrated in FIG. 3 with confidence level evaluation. As shown in FIG. 7, the process starts at step S0. In a first step S1, the electrical current Im flowing through the protective fuse 5 in the current path to at least one load 7 is acquired by means of a current sensor element 2. In a further step S2 of the flowchart illustrated in FIG. 7, it is checked whether any failure indicator flag FIF has been set true on a previous evaluation cycle EC. If this is the case and the amplitude of measured electrical current Im is found to be zero in step S3 of the flowchart in FIG. 7 then, in a possible embodiment, external state signals predicting that the measured current Im is zero can be evaluated in step S5. If there are no failure indicator flags FIFs set true in the previous evaluation cycle EC, trip conditions can be evaluated in step S4 on the basis of the measured electrical current Im for this evaluation cycle EC and the resulting failure indicator flags FIFs can be stored for the next evaluation cycle EC. Failure indicator flags are also reevaluated if measured electrical current Im is not found to be zero at step S3. This is important so that there is always an update for the next cycle EC as long as electrical current Im continuous to flow.

As illustrated in the flowchart of FIG. 7, failure indicator flags FIFs can be processed in step S6a to calculate a confidence level CONF-LEV indicating a total likelihood that a protective fuse 5 has failed. The calculated confidence level can indicate to a user which conditions have been fulfilled regardless of the actual fuse tripping. The confidence level indicating the total likelihood that the protective fuse 5 has failed can be calculated depending on the logical values (H/L) of the failure indicator flags FIFs and depending on at least one external state signal as also illustrated in FIG. 7. The external state signal can comprise in a possible embodiment a switching state signal SWSS which indicates that the associated load 7 has not been switched off externally by a protective switch 8.

The confidence level CONF-LEV can also reflect a history of the specific flags over various (maybe adjustable) evaluation cycles ECs. This provides information about the electrical stress the system has seen over time.

The provision of a parallel structure inside trip indication subsystem allows to distinguish between different confidence levels. In this way, an indication about a broken fuse becomes more reliable. The more failure indication flags FIFs have been set the more likely is it that the protective fuse 5 has broken or tripped.

A choice of the quantization time, i.e., the length of the evaluation cycle EC, can depend on implementation of the analog digital converter system. Typically, a protective fuse 5 acts in a range of some milliseconds. Choosing an ADC clock 10 to 100 times faster than the system time constants is a feasible approach. This still leads to a fairly low demand on the ADC site which allows to realize the ADC system easily. The proposed evaluation can be based on actual sample points or on pre-calculated RMS values.

Figure 8:
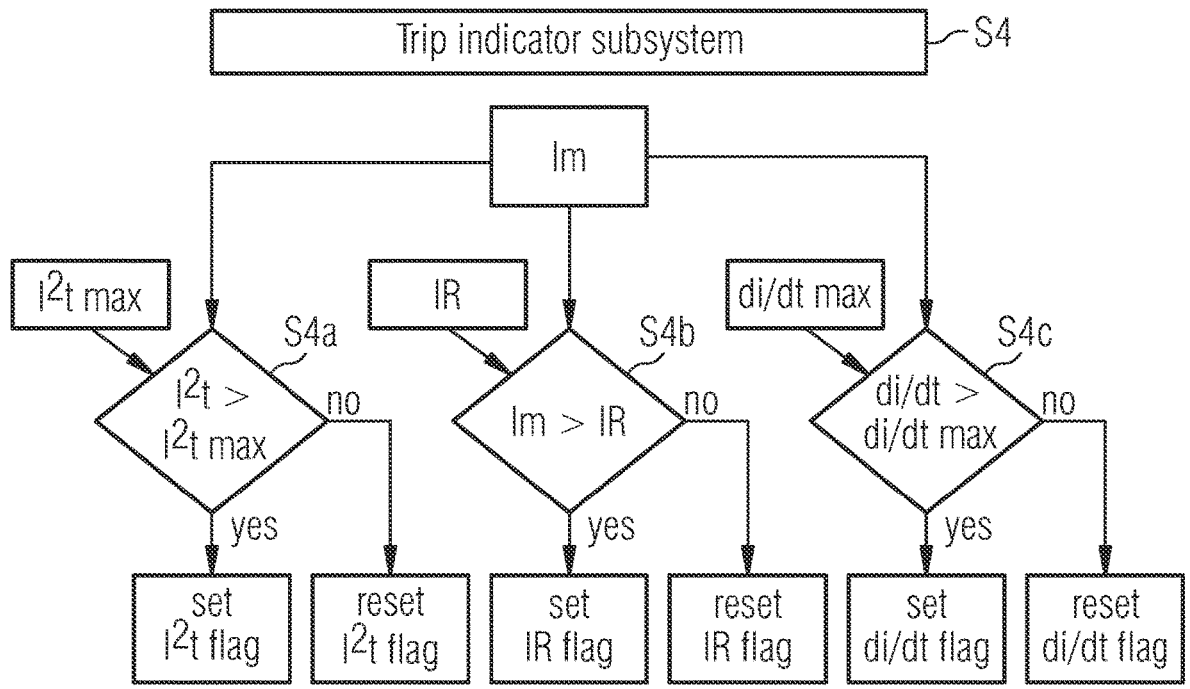
FIG. 8 shows a possible implementation of a trip indicator subsystem as employed by a method for detection of a failure of a protective fuse according the present invention.

FIG. 8 illustrates a possible implementation of a trip indicator subsystem as performed in step S4 of the flowchart illustrated in FIG. 7. As illustrated in FIG. 8, several failure indicators can be used. For each failure indicator FI, an associated failure indicator flag FIF can be provided. In the illustrated embodiment of FIG. 8, a first failure indicator comprises a calculated Ampere squared seconds I2t value indicating or representing a thermal energy generated in the protective fuse 5 exceeding a predefined threshold value. If the calculated Ampere squared seconds I2t value is higher than a predefined threshold value, a corresponding I2t flag FIF1 is set as illustrated in FIG. 8. If the calculated Ampere squared seconds I2t value is lower than the predefined threshold value, the corresponding I2t flag FIF1 is reset as shown in FIG. 8.

A second failure indicator FI2 can comprise that the amplitude of the measured electrical current Im exceeds a predefined rated current IR of the protective fuse 5. If the measured electrical current Im exceeds a predefined rated current IR, a corresponding IR flag FIF2 is set as shown in FIG. 8. On the contrary, if the measured electrical current does not exceed the predefined rated current IR of the protective fuse 5, the IR flag FIF2 is reset as shown in FIG. 8.

A third failure indicator FI3 can comprise a current increase or a current slope dI/dt of the measured electrical current Im exceeding a predefined current increase. If the current slope of the measured electrical current Im exceeds a maximum predefined current increase dI/dtmax, a corresponding dI/dt failure indication flag FIF3 is set as shown in FIG. 8. On the contrary, if the current slope of the measured electrical current does not exceed the predefined current increase, the corresponding reset dI/dt failure indicator flag FIF3 is reset as shown in FIG. 8.

Figure 9:
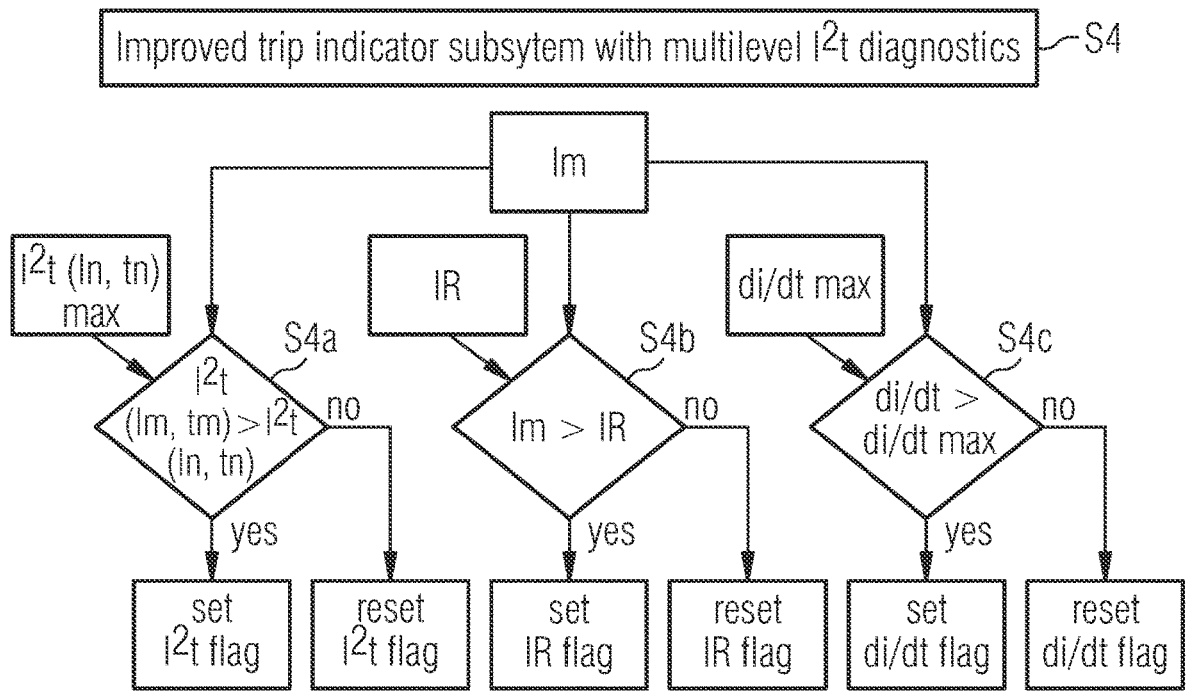
FIG. 9 shows a further possible implementation of a trip indicator subsystem with multilevel I2t diagnostics employed by a method for detection of a failure of a protective fuse according the present invention.

FIG. 9 shows a further variant of a trip indicator subsystem with multilevel I2t diagnostics.

The illustrated subsystem takes into account that a typical protective fuse 5 may have a non-constant I2t value depending on the time and amplitude of the electrical current Im applied to the protective fuse 5. The lower the amplitude of the measured electrical current Im is, the higher the I2t value will be for tripping the protective fuse 5. If the amplitude of the electrical current Im falls below the rated current IR, the I2t value might reach infinity and the protective fuse 5 does never trip. Consequently, a more precise prediction can be achieved if multiple values I2t (I1, t1); I2t (I2, t2); I2t (In, tn) are provided to the trip indicator subsystem. These multiple values can typically be selected from a datasheet of the manufacturer of the protective fuse 5. An interpolation can be applied between available data points as long as these are not located too far from each other. The I2t evaluation block can now adjust its compare value I2t (In, tn) to the actual electrical current Im or to an average current calculated over the last n evaluation samples. Besides a classical melting fuse, the characteristics of an electromechanic/bimetal circuit breaker can also be covered with the technique illustrated in the flowchart of FIG. 9.

Figure 10:
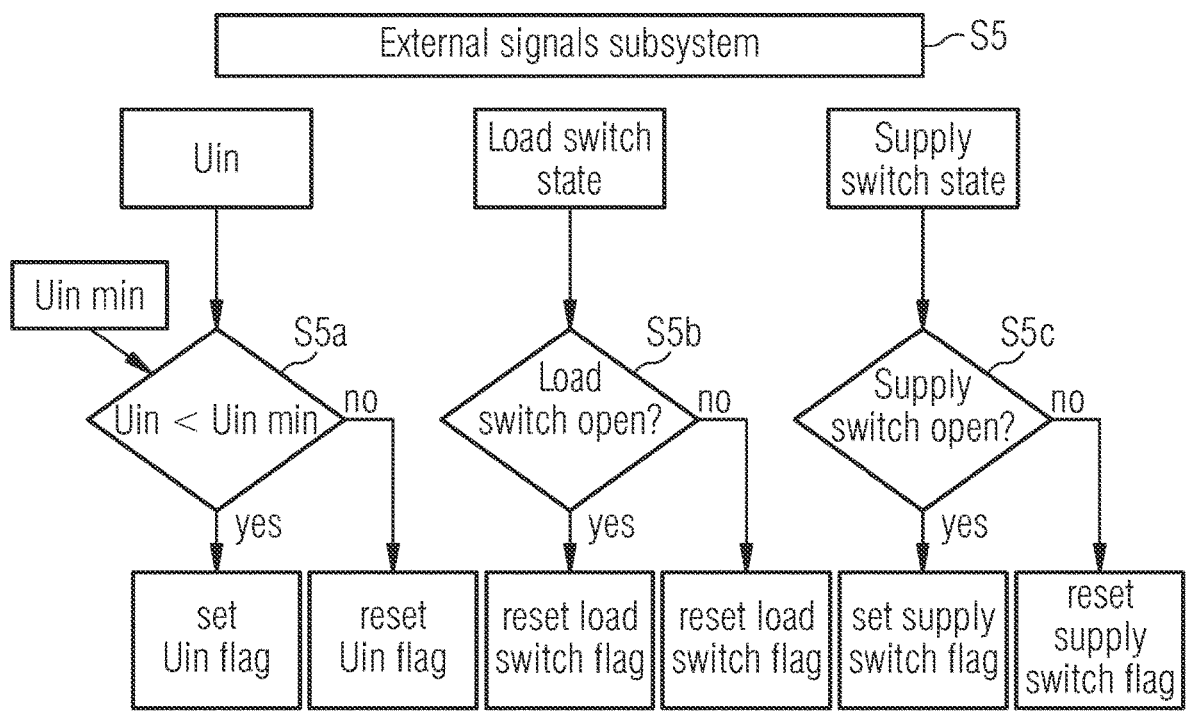
FIG. 10 shows a possible embodiment of an external signal subsystem as employed by a method for detection of a failure of a protective fuse according the present invention.

FIG. 10 illustrates a further variant of an external signal subsystem as applied in step S5 of the flowchart illustrated in FIG. 7. In this embodiment, a further improvement can be achieved by monitoring also the input voltage Uin on a grid side of the protective fuse 5. This value is typically quite easily accessible since a measurement device evaluating the electrical fuse current can be connected to a busbar of a power distribution system supplying multiple fused branch circuits. Consequently, a potential shutdown of the power supply grid cannot be misunderstood since this might also result in a zero-load current. By monitoring also the input voltage Uin on the power supply grid side of the protective fuse 5, a false interpretation of a fuse failure can be avoided. If the input voltage Uin on the power supply grid side of the protective fuse 5 is lower than a predefined minimum voltage Umin, a corresponding flag representing the input voltage Uin is set as illustrated in FIG. 10. Further external state signals can be used as well such as a supply switch state as illustrated in FIG. 10. If a supply switch is open, a corresponding supply switch flag can be set as shown in FIG. 10.

Further, a confidence level indicating a total likelihood that the protective fuse 5 has failed can be calculated depending on the logical value of the failure indication flags but also depending on the external state signals illustrated in the flowchart of FIG. 10 including the state signal representing the input voltage Uin on the power supply grid side of the protective fuse 5, load switch states and a supply switch state. Also, any knowledge about external switch states can be useful to avoid any kind of false interpretation of logical values of the failure indicator flags FIFs.

Figure 11:
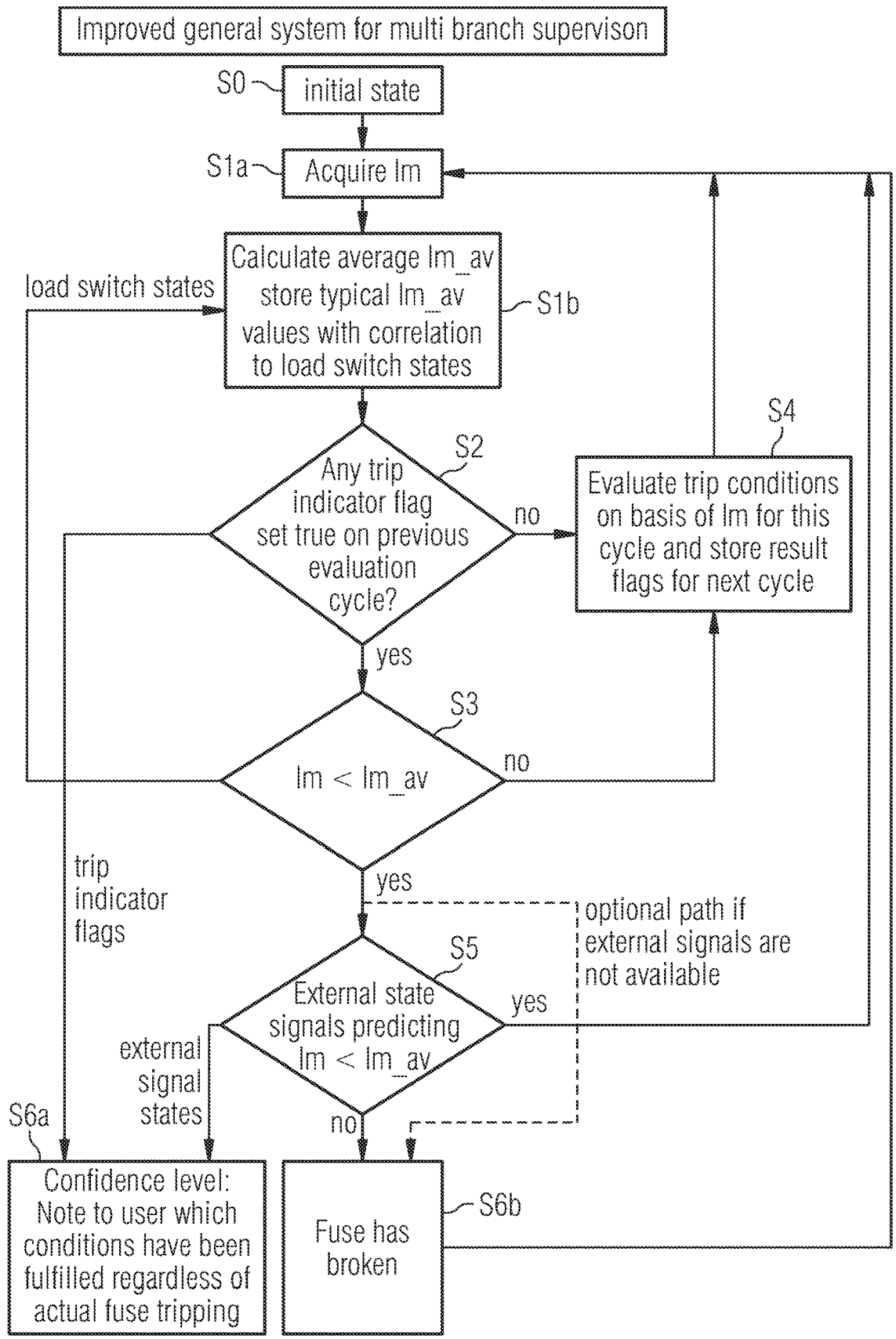
FIG. 11 shows a flowchart of steps of a further possible exemplary embodiment of a method for detection of a failure of a protective fuse according the present invention.

FIG. 11 shows a further flowchart for illustrating an improved general system for a multi-branch supervision.

After acquiring an amplitude of the measured electrical current in step S1a, an average current can be calculated and stored with correlation to determined load switch states in step S1b as shown in FIG. 11.

If the amplitude of the measured current is found to be less than the value of the calculated average current in step S3 and the external state signals predict that the measured current is less than the average current in step S5, it is determined that the protective fuse 5 has broken in step S6b as shown in FIG. 11.

A multi-branch evaluation as illustrated in FIG. 11 does work best if the load 7 is fairly constant or underlies a slow dynamic. Further, multi-branch evaluation can be performed, in particular if the fuse ratings of each branch are equal. Moreover, the multi-branch evaluation is more precise if less electrical branches are provided. If loads are switched by switching units, the switch state of the corresponding switching units shall be applied to the evaluation unit. The calculated Ampere squared seconds I2t value and the measured amplitude of the electrical current Im both represent summed/integrated values of the entire system. However, a high current slope value dI/dt is independent of the number of branches. Consequently, this failure indicator FI is the best indicator for a multi-branch evaluation. Additionally, the individual branch for an actual tripped protective fuse 5 may remain unknown. However, the branch can be detected by opening all load switches and checking the corresponding electrical current Im.

Figure 12:
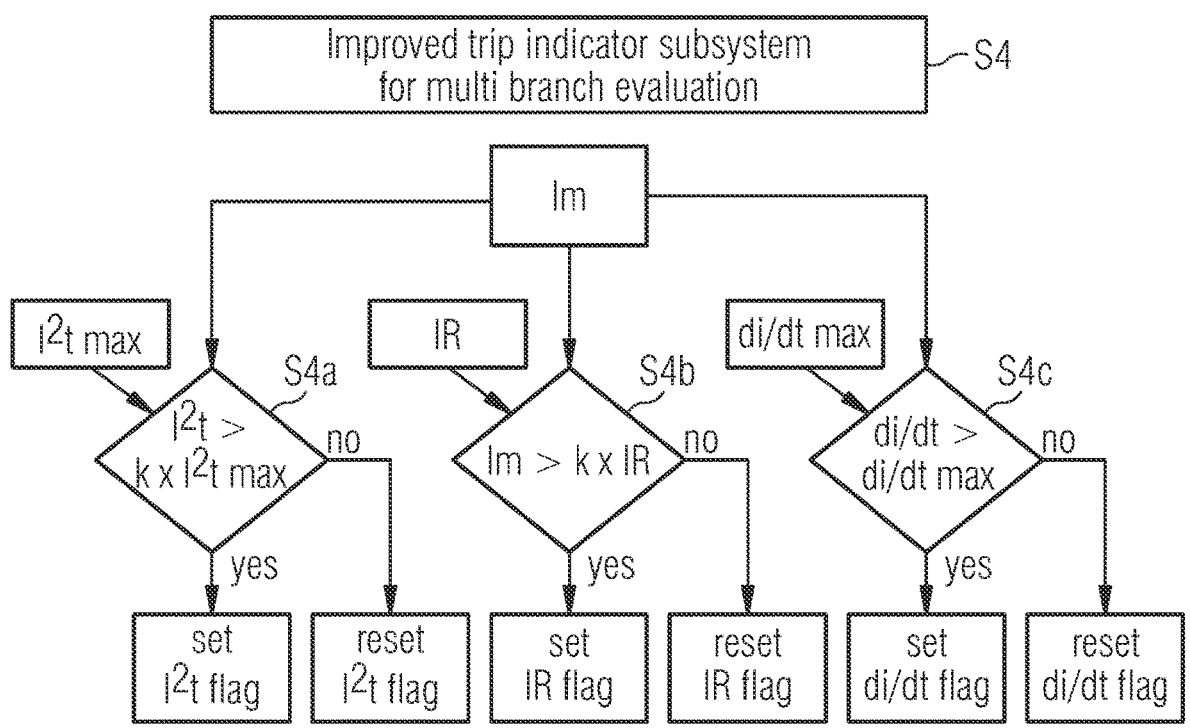
FIG. 12 shows a possible embodiment of a trip indicator subsystem for multi branch evaluation as employed by a method for detection of a failure of a protective fuse according the present invention.

FIG. 12 shows a further possible implementation of an improved trip indicator subsystem for multi-branch evaluation as performed in step S4 of the flowchart illustrated in FIG. 7. In the illustrated embodiment, the first failure FIL indicator, i.e., a calculated Ampere squared seconds I2t value and the second failure indicator FI2, i.e., the amplitude of the measured electrical current Im, can be scaled depending on a number k of parallel current paths or branches connected to multiple loads 7. In case of a multi-branch evaluation, several parallel current paths, i.e., branches can be monitored. Consequently, the I2t evaluation and the Im/IR comparison are scaled by the number k of parallel branches. In contrast, the current slope, i.e., the dI/dt value, is independent of the number of parallel branches. This can be useful to detect tripping events. The idea of adding a multilevel I2t supervision is also applicable in the embodiment illustrated in the flowchart of FIG. 12.

The invention claimed is:

1. A method for detection of a fuse failure of a protective fuse used to protect an associated load against overcurrent and/or against overload,
the method comprising the steps of:
measuring electrical current, $I_m$, flowing through the protective fuse in a current path to said load by means of a current sensor element;
determining one or more failure indicators, FIs, each adapted to indicate a possible failure of the protected fuse on the basis of the measured electrical current, $I_m$; and
detecting automatically a failure of the protective fuse if the determined at least one failure indicator, FI, indicates a possible failure of the protective fuse and if the electrical current, $I_m$, measured by the current sensor element has stopped to flow through said protective fuse or is below a predefined current threshold value.

2. The method according to claim 1 wherein a first failure indicator, FI1, comprises a calculated Ampere squared seconds ($I^2t$) value indicating a thermal energy generated in the protective fuse exceeding a predefined threshold value.

3. The method according to claim 2 wherein the first failure indicator, FI1, and the second failure indicator, FI2, are scaled depending on a number, k, of parallel current paths connected to multiple loads.

4. The method according to claim 2 wherein if the determined thermal energy indicated by the calculated Ampere squared seconds ($I^2t$) value does not exceed the predefined threshold value but the amplitude of the measured electrical current, $I_m$, is higher than a predetermined rated current, $I_R$, an energy input into said protective fuse caused by a flowing electrical current is determined.

5. The method according to claim 4 wherein if the determined energy input into the protective fuse by the electrical current exceeds a predetermined threshold value, an overload failure warning signal (OFWS) indicating an imminent failure of the protective fuse due to an overload current is automatically generated.

6. The method according to claim 5 wherein the energy input into the protective fuse is determined by calculating a heat transfer balance for the protective fuse as a difference between heat generated by the electrical current flowing through the protective fuse and heat dissipated by the protective fuse.

7. The method according to claim 1 wherein a second failure indicator, FI2, comprises a measured electrical current, $I_m$, exceeding a predefined rated current, $I_R$, of the protective fuse.

8. The method according to claim 7 wherein the first failure indicator, FI1, and the second failure indicator, FI2, are scaled depending on a number, k, of parallel current paths connected to multiple loads.

9. The method according to claim 1 wherein a third failure indicator, FI3, comprises a current increase or a current slope (dI/dt) of the measured electrical current, $I_m$, exceeding a predefined current increase ($dI/dt_{max}$).

10. The method according to claim 1 wherein each failure indicator, FI, comprises a failure indicator flag, FIF, being set or reset within a predefined evaluation cycle, EC, in response to the electrical current, $I_m$, measured by the current sensor element within the predefined evaluation cycle.

11. The method according to claim 10 wherein logical values of the failure indicator flags, FIFs, of the failure indicators, FIs, set or reset in an evaluation cycle, EC, are stored in a register for the next evaluation cycle.

12. The method according to claim 11 wherein momentary and historic logical values of the failure indicator flags, FIFs, of the failure indicators, FI, are processed to calculate a confidence level indicating a total likelihood that the protective fuse has failed.

13. The method according to claim 12 wherein a failure of the protective fuse is determined, if the calculated confidence level exceeds a predefined confidence level threshold and if the electrical current, $I_m$, measured by the current sensor element has stopped to flow through said protective fuse or is below a predefined current threshold value.

14. The method according to claim 12 wherein the confidence level indicating a total likelihood that the protective fuse has failed is calculated depending on the logical values of failure indicator flags and/or depending on at least one external state signal comprising an input voltage at an input side of the protective fuse, a load switch state and/or a supply switch state.

15. The method according to claim 14 wherein the external state signal comprises a switching state signal (SWSS) which indicates that the associated load has not been switched off externally by a protective switch.

16. The method according to claim 1 wherein the failure indicators, FIs, comprise multilevel failure indicators.

17. The method according to any of the preceding claims wherein an average electrical current, $I_{mavg}$, is calculated on the basis of the measured electrical currents, $I_m$, flowing through parallel current paths to the load and is used as a predefined current threshold ($I_{mth}$).

18. A fuse failure detection apparatus provided for detection of a failure of a protective fuse used to protect an associated load against overcurrent and/or against overload, said fuse failure detection apparatus comprising:
a current sensor element adapted to measure an electrical current, $I_m$, flowing through the protective fuse in a current path to said load;
a determination unit adapted to determine one or more failure indicators which are adapted to indicate a possible failure of the protective fuse on the basis of the electrical current, $I_m$, measured by said current sensor element; and
a failure detection unit adapted to detect automatically a failure of the protective fuse if the determined at least one failure indicator, FI, indicates a possible failure of the protective fuse and if the electrical current, $I_m$, measured by the current sensor element has stopped to flow through said protective fuse or is below a predefined current threshold value.

19. The fuse failure detection apparatus according to claim 18 wherein the at least one failure indicator, FI, comprises
a first failure indicator, FI1, comprising a calculated Ampere square seconds ($I^2t$) value indicating a thermal energy generated in the protective fuse exceeding a predefined threshold value,
a second failure indicator, FI2, comprising a measured electrical current, $I_m$, exceeding a predefined rated current, $I_R$, of the protective fuse; and
a third failure indicator, FI3, comprising a current increase (dI/dt) of the measured electrical current, $I_m$, exceeding a predefined current increase ($dI/dt_{max}$).

20. The fuse failure detection apparatus according to claim 19 wherein the first failure indicator, FI1, and the second failure indicator, FI2, are scaled depending on a number, k, of parallel current paths connected to multiple loads.

21. The fuse failure detection apparatus according to claim 19 wherein the failure detection unit is adapted to generate an overload failure warning signal (OFWS), if the determined energy input into the protective fuse by the electrical current, I, exceeds a predetermined threshold value, wherein the generated overload failure warning signal (OFWS) indicates an imminent failure of the protective fuse due to an overload current.

22. The fuse failure detection apparatus according to claim 18 wherein each failure indicator, FI, comprises a failure indicator flag, FIF, being set or reset within a predefined evaluation cycle, EC, in response to the electrical current, $I_m$, measured by the current sensor element within the predefined evaluation cycle.

23. The fuse failure detection apparatus according to claim 22 wherein the failure indicator flags, FIF, of the failure indicators, FI, being set or reset in an evaluation cycle, EC, are stored in a corresponding register for the next evaluation cycle.

24. The fuse failure detection apparatus claim 18 further comprising a calculation unit adapted to process the stored failure indicator flags, FIFs, of the failure indicators, FIs, to calculate a confidence level indicating a total likelihood that the protective fuse has failed.

25. The fuse failure detection apparatus according to claim 24 wherein a failure of the protective fuse is determined if the calculated confidence level exceeds a predefined confidence level threshold and if the electrical current, $I_m$, measured by the current sensor element has stopped to flow through said protective fuse or is below a predefined current threshold value.

26. The fuse failure detection apparatus according to claim 24 wherein the confidence level indicating a total likelihood that the protective fuse has failed is calculated by the calculation unit depending on the logical value of failure indication flags, FIFs, and depending on at least one external state signal.

27. The fuse failure detection apparatus according to claim 26 wherein the external state signal comprises a switching state signal (SWSS) which indicates that the associated load has not been switched off externally by a protective switch.

28. The fuse failure detection apparatus according to claim 24 wherein the calculation unit is adapted to calculate an average electrical current, $I_{mavg}$, on the basis of the measured electrical currents, $I_m$, flowing through parallel current paths to the load wherein the calculated average electrical current, $I_{mavg}$, is used as the predefined current threshold ($I_{mth}$).

29. The fuse failure detection apparatus according to claim 18 wherein the failure indicators, FIs, comprises multilevel failure indicators.

30. The fuse failure detection apparatus according to claim 18 wherein the failure detection unit is adapted to generate automatically a fuse failure detection signal (FFDS) indicating a likely failure of the protective fuse due to a short circuit current if the at least one failure indicator, FI, indicates a possible failure of the protective fuse and if the electrical current, $I_m$, measured by the current sensor element is stopped to flow through the protective fuse or if the electrical current, $I_m$, measured by the current sensor element is below a predefined current threshold value.

31. The fuse failure detection apparatus according to claim 18 wherein the determination unit is adapted to calculate an Ampere squared seconds ($I^2t$) value representing a thermal energy generated at the protective fuse in response to the electrical current, $I_m$, measured by the current sensor element and wherein the failure detection unit is adapted to compare the calculated Ampere square seconds ($I^2t$) value with a predetermined Ampere square seconds ($I^2t$) value to generate a fuse failure detection signal (FFDS), if the determined thermal energy has exceeded a predetermined threshold value and the electrical current, $I_m$, measured by the current sensor element has stopped to flow through said protective fuse and if a received switching state signal (SWSS) indicates that the associated load has not been switched off externally by a protective switch.

32. The fuse failure detection apparatus according to claim 31 wherein the determination unit is further adapted to determine an energy input into said protective fuse caused by the flowing electrical current, $I_m$, if the determined thermal energy does not exceed the predetermined threshold value but the amplitude of the measured electrical current, $I_m$, is higher than a predetermined rated current.

33. The fuse failure detection apparatus according to claim 18 wherein the determination unit is adapted to determine an energy input into the protective fuse by calculating a heat transfer balance for the protective fuse as a difference between heat generated by the electrical current, I, flowing through the protective fuse and heat dissipated by the protective fuse.

34. The fuse failure detection apparatus according to claim 18 wherein the current sensor component is adapted to measure an electrical DC current and/or is adapted to measure an electrical AC current flowing through the corresponding current path.

35. The fuse failure detection apparatus according to claim 18 wherein the current sensor element is serially connected to the protective fuse within a current supply path of the load or is attached to the current supply path of the load.

36. The fuse failure detection apparatus according to claim 18 wherein the failure detection unit comprises an interface to receive external state signals, in particular from a protective switch which is connected in series with the protective fuse along the current supply path of the load.

37. The fuse failure detection apparatus according to claim 18 comprising a user interface adapted to output a failure warning signal, momentary states of the failure indicators, FIs, and of the state signals and to output a confidence level indicating a total likelihood that the protective fuse has failed calculated by a calculation unit depending on the logical values of failure indication flags, FIFs, of the failure indicators, FIs, and depending on at least one external state signal.

38. An adapter device comprising a fuse failure detection apparatus provided for detection of a failure of a protective fuse used to protect an associated load against overcurrent and/or against overload, said fuse failure detection apparatus comprising:
a current sensor element adapted to measure an electrical current, $I_m$, flowing through the protective fuse in a current path to said load;
a determination unit adapted to determine one or more failure indicators which are adapted to indicate a possible failure of the protective fuse on the basis of the electrical current, $I_m$, measured by said current sensor element; and
a failure detection unit adapted to detect automatically a failure of the protective fuse if the determined at least one failure indicator, FI, indicates a possible failure of the protective fuse and if the electrical current, $I_m$, measured by the current sensor element has stopped to flow through said protective fuse or is below a predefined current threshold value.

\* \* \* \* \*